US006825726B2

(12) United States Patent
French et al.

(10) Patent No.: US 6,825,726 B2
(45) Date of Patent: Nov. 30, 2004

(54) POWER AMPLIFIER WITH MULTIPLE POWER SUPPLIES

(75) Inventors: John Barry French, Caledon East (CA); Charles Robert May, Spencerville (CA)

(73) Assignee: Indigo Manufacturing Inc., Markham (CA)

( * ) Notice: Subject to any disclaimer, the term of this patent is extended or adjusted under 35 U.S.C. 154(b) by 41 days.

(21) Appl. No.: 09/902,708

(22) Filed: Jul. 12, 2001

(65) Prior Publication Data

US 2002/0030543 A1 Mar. 14, 2002

Related U.S. Application Data

(60) Provisional application No. 60/217,684, filed on Jul. 12, 2000.

(51) Int. Cl.[7] ............................. H03F 3/04; G05F 1/656
(52) U.S. Cl. ...................................... 330/297; 323/222
(58) Field of Search ................... 330/10, 297; 323/282, 323/222, 314, 313; 363/41, 17, 40, 55, 58, 98, 132

(56) References Cited

U.S. PATENT DOCUMENTS

| | | |
|---|---|---|
| 3,772,606 A | 11/1973 | Waehner |
| 4,054,843 A | 10/1977 | Hamada |
| 4,087,759 A | 5/1978 | Iwamatsu |
| 4,115,739 A | 9/1978 | Sano et al. |
| 4,430,625 A | 2/1984 | Yokoyama |
| 4,498,057 A | 2/1985 | Noro |
| 4,507,619 A | 3/1985 | Dijkstra et al. |
| 4,720,668 A | 1/1988 | Lee et al. |
| 4,961,032 A | 10/1990 | Rodriguez-Cavazos |
| 5,075,634 A | 12/1991 | French |

(List continued on next page.)

FOREIGN PATENT DOCUMENTS

EP        0 519 471 A    12/1992

Primary Examiner—Khanh V. Nguyen
(74) Attorney, Agent, or Firm—Bereskin & Parr

(57) ABSTRACT

A power amplifier for receiving an input signal and providing a corresponding amplified output signal. One embodiment of the power amplifier includes a positive half circuit for supplying power to an amplifier during positive half waves of the output signal and a negative half circuit for supplying power to the amplifier during negative half waves of the output signal. Each half circuit has a main power supply, which is typically a switching regulator, and which supplies a first power signal to the amplifier. The slew rate of this first power signal is intentionally limited to control EMI emissions. Each half circuit also has a transient power supply which may be selectively engaged to provide a second power signal to the amplifier when the first power signal is insufficient to power the amplifier. Each half circuit may also include a low voltage power supply which provides a third power signal to the amplifier, allowing the main power supply to be disabled when a low power level is required, further reducing EMI emissions. Each half circuit has a control circuit which regulates the power output from the main and transient power supplies. The control circuit may provide a pulse width modulated control signal or a pulse density modulated control signal to control the switching regulator. If a pulse density control signal is provided, the switching regulator may be a resonant switching regulator. The power amplifier may be modified for use with a bridge amplifier, with multiple channels and may incorporate an overload detection circuit. In another embodiment of power amplifier the transient power supply is replaced with a transient control circuit that, when the first power supply is insufficient to power the amplifier, temporarily forces the first power supply to a 100% duty cycle, and then for a longer period, increases the duty cycle from its normal level to allow the first power supply to adequately power the amplifier more quickly.

96 Claims, 17 Drawing Sheets

U.S. PATENT DOCUMENTS

| | | |
|---|---|---|
| 5,200,711 A | 4/1993 | Andersson et al. |
| 5,347,230 A | 9/1994 | Noro |
| 5,450,037 A | 9/1995 | Kanaya et al. |
| 5,479,337 A | 12/1995 | Voigt |
| 5,510,753 A | 4/1996 | French |
| 5,825,248 A | 10/1998 | Ozawa |
| 5,892,404 A | 4/1999 | Tang |
| 5,990,751 A * | 11/1999 | Takita ......................... 330/10 |
| 6,166,605 A * | 12/2000 | Carver ....................... 330/297 |
| 6,236,273 B1 * | 5/2001 | Lewyn ....................... 323/314 |

* cited by examiner

POWER AMPLIFIER WITH MULTIPLE POWER SUPPLIES

FIELD OF THE INVENTION

This invention relates to power amplifiers. More particularly, the invention relates to power amplifiers which efficiently amplify one or more input signals with a large dynamic range while producing low electromagnetic emissions.

BACKGROUND OF THE INVENTION

A music audio signal or a movie soundtrack typically has a large dynamic range. Such signals often have a peak-to-average magnitude ratio of 8-to-1 or even higher. In addition, peaks in such signals are relatively infrequent and at most times, the signal has a magnitude close to its average magnitude. A power amplifier for such a signal must be capable of producing an output signal with corresponding high peaks and with a comparatively low average magnitude. A number of power amplifiers are known which vary the power supplied to the power amplifier's main amplification circuit (or amplifier) so that there is limited headroom between the supplied power and the magnitude of the power amplifier's output signal.

For example, U.S. Pat. No. 3,772,606 describes a linear class H power amplifier with four fixed power rails. Two of the rails are used to supply power to the amplifier of the power amplifier during positive half waves of the output signal and the other two rails are used to supply power to the power amplifier during negative half waves of the output signal. Of the two rails used to supply the main amplifier during the positive half waves of the output signal, one is a low voltage rail and the other is a high voltage rail. Only the low voltage rail is used to power the amplifier when the output signal has a magnitude well below that of the low voltage rail. As the output signal approaches the low voltage rail, the high voltage rail is turned on to supply additional power. This device effectively reduces the average voltage drop (i.e. the headroom) from the supply rail to the output signal, thereby improving the efficiency of the power amplifier. However, this solution is far from ideal, especially where the output signal has an average level substantially less than the lower supply rail, or slightly higher than the lower supply rail. In either case, there will still be substantial headroom between the output signal and the power supplied to the amplifier.

U.S. Pat. No. 4,430,625 describes a power amplifier that addresses this problem by providing low voltage rails which have a variable magnitude proportional to the magnitude of the output signal. The low voltage rails are provided by a switching regulator and their magnitude is controlled using a fixed frequency pulse width modulated (PWM) control signal. When the low voltage rails are insufficient to power the amplifier, high voltage rails provided by fast acting linear regulators are utilized to make up for the deficiency. This device further reduces the headroom between the output signal and the power supply to the amplifier when the output signal is lower than the low voltage rails. However, it is susceptible to high electromagnetic interference (EMI) emissions due to its hard-switching low voltage regulators. In addition, this device has no mechanism for predicting the power required by the amplifier to generate the output signal at any particular time. This results in the power supply from the switching regulators being deficient when the input signal rises rapidly and in the worst case may cause the switching regulators to be deficient during every half wave (or during many half waves) of the output signal. This in turn leads to overuse of the linear regulators, increasing the power consumption of the power amplifier and decreasing its overall efficiency.

U.S. Pat. No. 5,347,230 describes a power amplifier which attempts to reduce the usage of the linear regulators by monitoring the current in the linear regulator and controlling the output of the switching regulator in a way that minimizes the current drawn from the linear regulator. The control circuit of this power amplifier is responsive to changes in the output signal to vary the power provided by the switching regulators. This design, which is responsive rather than predictive, leads to a slow response time for the switching regulators, possibly resulting in increased usage of the linear regulators. Furthermore, this device utilizes fast-switching switching regulators which generate large EMI emissions. In addition, this device suffers from a load dumping problem which may force a high current from a current source through a high impedance load, resulting in a large voltage spike across the load.

None of these devices is well suited for use with multiple channels. Most modern audio amplifiers produce at least five output channels (i.e. surround sound systems) and many produce six or more output channels (including a subwoofer output). This is in contrast to the two channel systems (i.e. left and right signals) which were common in the past. Providing five or more duplicate power supply circuits for each power amplifier within a single audio amplifier increases both the size and cost of the audio amplifier.

Furthermore, none of these devices provide for protection of the amplification from over-current, over-temperature or other overload conditions. Such protection is essential for practical commercial use of a power amplifier circuit.

Accordingly, there is a need for a power amplifier for audio signals that provides an efficient power supply with low EMI emissions and with low headroom between the power supplied to the amplification circuit and the output signal of the power amplifier. It is preferable if the power amplifier has a predictive control system that allows the headroom to be reduced while ensuring that sufficient power is provided to the amplification circuit (or circuits) at all times. It is also preferable that the control circuit and regulation system of the power amplifier be adaptable for use with multiple channels. It is also desirable that the power amplifier be adaptable to protect the amplification circuit of each channel so as to prevent the amplification circuit from being damaged by over-current, over-temperature or other overload conditions.

SUMMARY OF THE INVENTION

In a first embodiment, the present invention provides: a power amplifier for receiving an input signal at an input terminal and producing an output signal at an output terminal, the output signal corresponding to the input signal, the power amplifier having a first power supply circuit comprising: an amplifier coupled to the input terminal for receiving the input signal and coupled to the output terminal for providing the output signal, the amplifier having a power input terminal for receiving a power input signal; a switching regulator coupled to the power input terminal for providing a switching power signal to the amplifier, wherein the switching power signal forms a first part of the power input signal; a linear regulator coupled to the power input terminal, the linear regulator being selectively engageable to provide a linear power signal to the amplifier, wherein the linear power signal forms a second part of the power input signal; an input signal processing circuit coupled to the input terminal for receiving the input signal and for providing a rectified signal indicating the amount of power required by the amplifier; a control circuit coupled to the input signal processing circuit and to the power input terminal for controlling the switching power signal and the linear power signal in response to an error signal corresponding to the rectified signal and the power input signal; a linear regulator control circuit coupled to the input signal processing circuit for receiving the rectified signal and coupled to the linear regulator for controlling the engagement of the linear regulator in response to the rectified signal.

In a second embodiment, the present invention provides a power amplifier for receiving an input signal at an input terminal and producing an output signal at an output terminal, the output signal corresponding to the input terminal, the power amplifier having a first power supply circuit comprising: an EMI isolation circuit coupled to the input terminal for receiving the input signal and to an internal input node for providing an EMI-decoupled signal corresponding to the input signal an amplifier coupled to the input terminal for receiving the input signal and coupled to the output terminal for providing the output signal, the amplifier having a power input terminal for receiving a power input signal; a switching regulator coupled to the power input terminal for providing a switching power signal to the amplifier, wherein the switching power signal forms a first part of power input signal; a linear regulator coupled to the power input terminal, the linear regulator being selectively engageable to provide a linear power signal to the amplifier, wherein the linear power signal forms a second part of the power input signal; an input signal processing circuit coupled to the internal input node for receiving the EMI-decoupled signal and for providing a rectified signal indicating the amount of power required by the amplifier; a control circuit coupled to the internal input signal processing circuit and to the power input terminal for controlling the switching power signal and the linear power signal in response to an error signal corresponding to the rectified signal and the power input signal; a linear regulator control circuit coupled to the input signal processing circuit for receiving the rectified signal and coupled to the linear regulator for controlling the engagement of the linear regulator in response to the rectified signal.

A power amplifier for receiving a first input signal at a first input terminal and for producing a first output signal at a first output terminal, the first output signal corresponding to the first input signal, a first signal amplifier being coupled to the first input terminal to receive the first input signal and coupled to the first output terminal to provide the first output signal; the first signal amplifier having a first power terminal for receiving a total power signal and the power amplifier having a first power supply circuit comprising: a first input signal compensation block coupled to the first input terminal to receive the first input signal and to provide a compensated input signal corresponding to the first input signal, wherein the compensated input signal defines a target power level; a power signal compensation block for receiving the total power signal and for providing a compensated power signal corresponding to the total power signal; a summer coupled to the first input signal compensation block and to the power signal compensation block for providing an error signal corresponding to a difference between the target power level and a power level of the total power signal; a control circuit coupled to the summer for receiving the error signal and for providing a first control signal and a second control signal in response to the error signal, wherein the first control signal corresponds to a target main power signal level and the second control signal corresponds to a target transient power signal level; a transient detect block coupled to the first input signal compensation block for providing a transient signal to identify a transient condition when a rate of change in a slew rate of the compensated input signal exceeds a selected transient threshold; a main power supply for providing a main power signal at the first power terminal in response to the first control signal; and a selectively engageable transient power supply for providing a transient power signal at the first power terminal in response to the second control signal and the transient signal, wherein the transient power supply is engaged when the transient signal indicates that a transient condition exists; wherein the control circuit provides the first and second control signals such that the target main power signal level is equal to or higher than the target transient power signal level and wherein the magnitude of the total power signal is generally equal to the higher of the magnitude of the main power signal or the magnitude of the transient power signal.

A power amplifier for receiving a first input signal at a first input terminal and for producing a first output signal at a first output terminal, the first output signal corresponding to the first input signal, a first signal amplifier being coupled to the first input terminal to receive the first input signal and coupled to the first output terminal to provide the first output signal, the first signal amplifier having a first power terminal for receiving a total power signal and the power amplifier having a first power supply circuit comprising: a first input signal compensation block coupled to the first input terminal to receive the first input signal and to provide a compensated input signal corresponding to the first input signal, wherein the compensated input signal defines a target power level; a power signal compensation block for receiving the total power signal and for providing a compensated power signal corresponding to the total power signal; a summer coupled to the first input signal compensation block and to the power signal compensation block for providing an error signal corresponding to a difference between the target power level and the power level of the total power signal; a transient detect block coupled to the first input signal compensation block for providing a transient signal to identify a transient condition when a rate of change in a slew rate of the compensated input signal exceeds a selected transient threshold; a first transient control circuit coupled to the transient detect block for providing first and second digital transient control signals, wherein the first digital transient control signal indicates the occurrence of a transient condition for a first time period in response to the transient signal and wherein the second digital transient control signal indicates the occurrence of a transient condition for a second time period in response to the transient signal, and wherein the second time period is longer than the first time period; a control circuit coupled to the summer for receiving an amplified error signal for providing a first control signal in response to the amplified error signal; a signal combining block for combining the first control signal and the first transient control signal to provide a main power supply control signal; a selectively engageable second transient control circuit coupled to the first transient control circuit for receiving the second digital transient control signal and for temporarily increasing the magnitude of the error signal, wherein the second transient control circuit is engaged and disengaged in response to the second digital transient control signal, the second transient control circuit including a feedback amplifier coupled between the summer and the control circuit to provide the amplified error signal, the feedback amplifier being operative at all times; and a main power supply for providing a main power signal at the first power terminal in response to the main power supply control signal; wherein the total power signal corresponds to the main power signal.

A method of supplying a total power signal to a signal amplifier, comprising: receiving an input signal; producing a compensated input signal corresponding to the input signal, the compensated input signal defining a target power level for the total power signal; comparing the compensated input signal to a reduced version of the total power signal to produce an error signal; providing first and second control signals in response to the error signal; providing a main power signal using a switching regulator in response to the first control signal, the main power signal being a first part of the total power signal; comparing a rate of change of the compensated input signal to a selected transient threshold to provide a transient signal, the transient signal identifying a transient condition when the rate of change exceeds the transient threshold, the transient threshold corresponding to a maximum slew rate of the main power signal; and engaging a transient power supply to provide a transient power signal in response to the second control signal, when the transient signal indicates the transient condition, the transient power signal being a second part of the total power signal.

A method of supplying a total power signal to a signal amplifier, comprising: receiving an input signal; producing a compensated input signal corresponding to the input signal, the compensated input signal defining a target power level for the total power signal; comparing the compensated input signal to a reduced version of the total power signal to produce an error signal; providing first and second control signals in response to the error signal; providing a main power signal using a switching regulator in response to the first control signal, the main power signal being a first part of the total power signal; comparing a rate of change of the compensated input signal to a selected transient threshold to provide a transient signal, the transient signal identifying a transient condition when the rate of change exceeds the transient threshold, the transient threshold corresponding to a maximum slew rate of the main power signal; and in response to a transient condition, temporarily engaging the switching regulator with a 100% duty cycle for a first time period and temporarily, elevating the error signal for a second time period.

A power amplifier for receiving a first input signal at a first input terminal and for producing a first output signal at a first output terminal, the first output signal corresponding to the first input signal, a first signal amplifier being coupled to the first input terminal to receive the first input signal and coupled to the first output terminal to provide the first output signal, the first signal amplifier having a first power terminal for receiving a total power signal and said power amplifier having a first power supply circuit comprising: a first input signal compensation block coupled to the first input terminal to receive the first input signal and to provide a compensated input signal corresponding to the first input signal, wherein the compensated input signal defines a target power level; a main power signal compensation block for receiving a main power signal and for providing a compensated main power signal corresponding to the main power signal; a first summer coupled to the first input signal compensation block and to the main power signal compensation block for providing a first error signal corresponding to a difference between the target power level and a power level of the main power signal; a first control circuit coupled to the first summer for receiving the first error signal and for providing a first control signal in response to the first error signal, wherein the first control signal corresponds to a target main power signal level; a total power signal compensation block for receiving the total power signal and for providing a compensated total power signal corresponding to the total power signal; a second summer coupled to the first input signal compensation block and to the total power signal compensation block for providing the second error signal corresponding to a difference between the target power level and a power level of the total power signal; a second control circuit coupled to the second summer for receiving the second error signal and for providing a second control signal in response to the second error signal, wherein the second control signal corresponds to a target transient power signal level; a transient detect block coupled to the first input signal compensation block for providing a transient signal to identify a transient condition when a rate of change in a slew rate of the compensated input signal exceeds a selected transient threshold; a main power supply for providing a main power signal at the first power terminal in response to the first control signal; and a selectively engageable transient power supply for providing a transient power signal at the first power terminal in response to the second control signal and the transient signal, wherein the transient power supply is engaged when the transient signal indicates that a transient condition exists; wherein the magnitude of the total power signal is generally equal to the higher of the magnitude of the main power signal or the magnitude of the transient power signal.

BRIEF DESCRIPTION OF THE DRAWINGS

The present invention will be described, by way of example only, with reference to the drawings, in which.

DETAILED DESCRIPTION OF EXEMPLARY EMBODIMENTS

Figure 1:
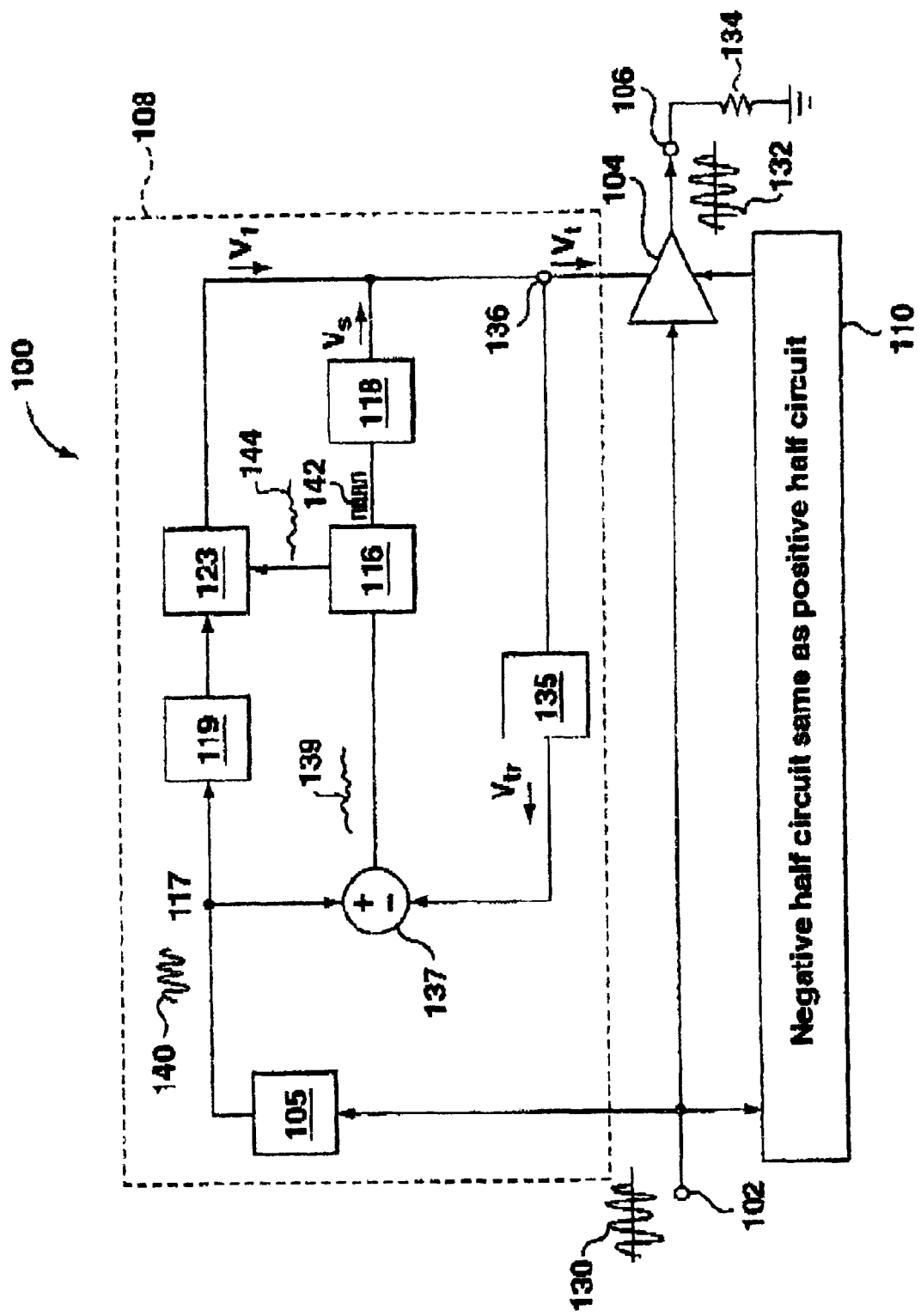
FIG. 1 is a block diagram of a first embodiment of a power amplifier according to the present invention.

Several exemplary power amplifiers made according to the present invention will now be described. Corresponding components of each power amplifier are identified by the same or similar reference numerals.

Reference is first made to FIG. 1, which is a block diagram of a power amplifier 100 according to the present invention. Power amplifier 100 has an input terminal 102, a positive half circuit 108, an amplifier 104, and output terminal 106 and a negative half circuit 110.

Input terminal 102 is configured to receive an input signal 130. Amplifier 104 is coupled to input terminal 102 to receive input signal 130 and to provide a corresponding output signal 132 at an output terminal 106. A load 134 is coupled to output terminal 106 to receive output signal 132.

Positive half circuit 108 has an input signal compensation block 105, a summer 137, a control circuit 116, a main power supply 118, a transient detect block 119, a transient power supply 123 and an output power signal compensation block 135. Negative half circuit 110 has the same structure as positive half circuit 108 and has a complementary operation. Only positive half circuit 108 will be described in detail.

Input compensation block 105 is coupled to input terminal 102 to receive input signal 130 and to provide a compensated input signal 140 at a terminal 117. Amplifier 104 receives a power signal $V_t$ from a positive power terminal 136. Power signal $V_t$ is the sum of a power signal $V_s$ provided by main power supply 118 and a power signal $V_I$ provided by transient power supply 123. The voltage of power signal $V_t$ is equal to the greater of the voltages of power signals $V_s$ and $V_I$. Output power signal compensation block 135 is coupled to positive power terminal 136 and provides a compensated power signal $V_{tr}$, which has a range comparable to that of compensated input signal 140. Summer 137 compares compensated input signal 140 to compensated power signal $V_{tr}$ and provides an error signal 139.

Control circuit 116 receives error signal 139 and produces a first control signal 142 to control main power supply 118. Main power supply 118 is responsive to first control signal 142 and produces power signal $V_s$ with a magnitude corresponding to control signal 142.

At any particular time when power amplifier 100 is in operation, amplifier 104 will require sufficient power $V_{req}$ to produce output power signal 132. The specific amount of power $V_{req}$ required will vary depending on the magnitude of input signal 130, the amount of amplification desired and power required to power the components of amplifier 104. Any excess power supplied to amplifier 104 will be dissipated in amplifier 104. Such dissipated power is lost and increases the power consumption of power amplifier 100. Accordingly, it is desirable to reduce the headroom between power signal $V_t$ and the required power level $V_{req}$. For reasons explained below, it is desirable to provide a safety margin between $V_t$ and $V_{req}$.

Input compensation block 105 and output power signal compensation block 135 are configured to produce compensated input signal 140 and compensated power signal $V_{tr}$ such that error signal 139 will be zero or almost zero (i.e. compensated input signal 140 will be approximately equal to compensated power signal $V_{tr}$) when output power signal $V_t$ has a magnitude $V_{targ}$ that is slightly greater than $V_{req}$. Control circuit 116 produces control signal 142 so that main power supply 118 produces power signal $V_s$ with a magnitude equal to $V_{targ}$. This condition is the "normal operation" of power amplifier 100. Under normal operation, transient power supply 123 is inoperative.

Power signal $V_s$ thus follows the waveform of output signal 132 with a headroom of $V_{targ}-V_{req}$, during the normal operation of power amplifier 100. For various reasons (described below), it may be desirable to reduce the slewing rate of main power supply 118. This can have the result that, if a large transient occurs in the input signal 130, power signal $V_s$ will not be able to track output signal 132. Power signal $V_s$ may have a magnitude less that $V_{targ}$ or even less than $V_{req}$ for a finite time.

During this finite time, power amplifier 100 enters a "transient" and transient power supply 123 is engaged to provide power signal $V_s$ to amplifier 104. Transient detection block 119 monitors compensated input power signal 140 at terminal 117 and, when a transient that exceeds a selected threshold occurs in input signal 130, transient detection block 119 enables transient power supply 123. The threshold is selected so that transient power supply 123 will be engaged when main power supply 118 is unlikely to be able to provide power signal $V_s$ with a magnitude approximately equal to $V_{targ}$. The selection of the threshold will depend on the slew rate of main power supply 118.

Transient power supply 123 has a very short slewing time and produces power signal $V_I$ in response to a second control signal 144 provided by control circuit 116. Control circuit 116 configures control signal 144 so that power signal $V_I$ will be approximately equal to $V_{targ}$. (The magnitude of power signal $V_I$ is discussed in detail below.) When transient detection block 119 enables transient power supply 123, transient power supply 123 quickly produces power signal $V_I$ approximately equal to $V_{targ}$. Power signal $V_t$ thereby has a magnitude approximately equal to $V_{targ}$, providing approximately the desired amount of headroom for amplifier 104.

Figure 2:
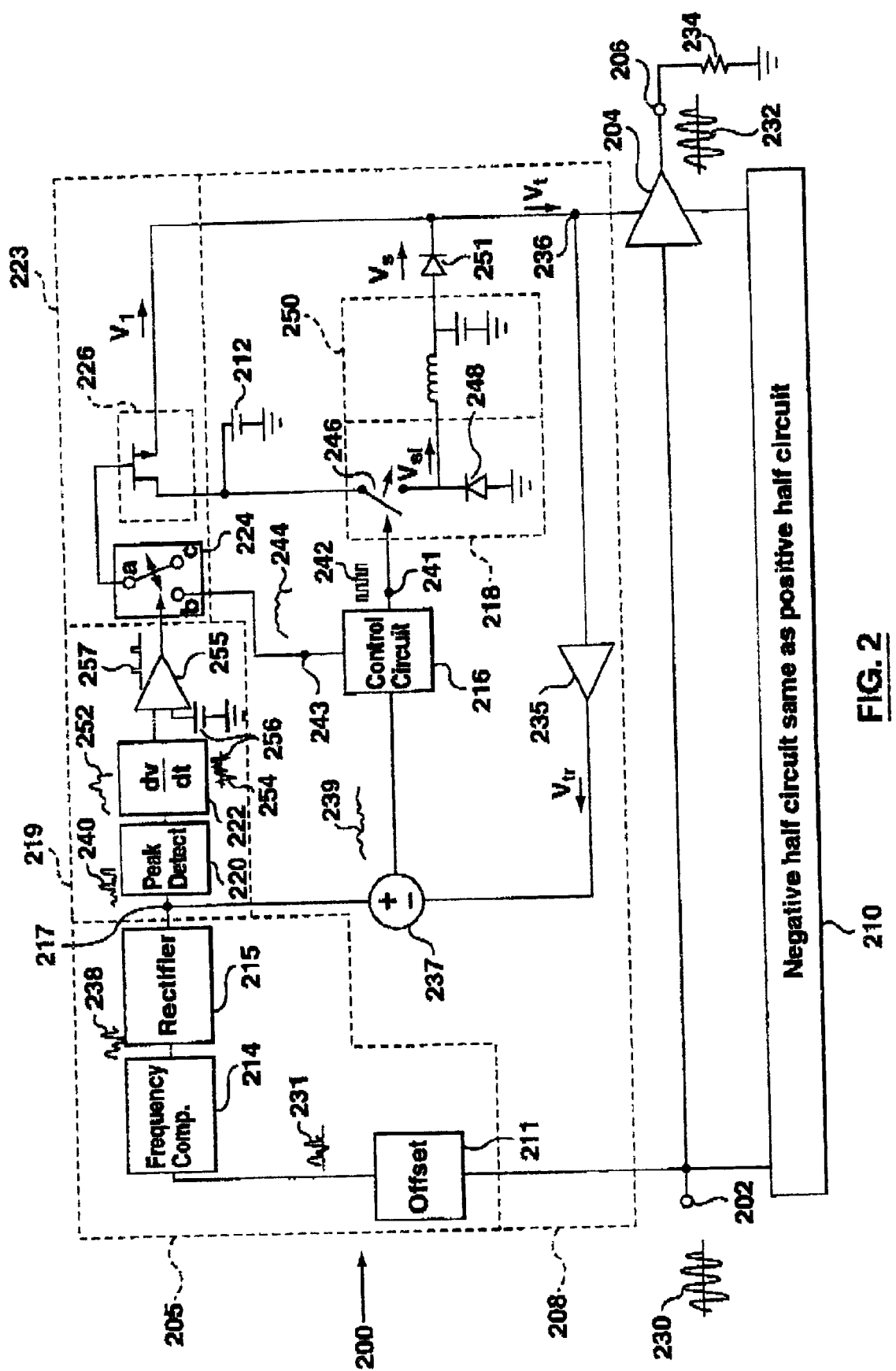
FIG. 2 illustrates a second embodiment of a power amplifier according to the present invention.

Reference is next made to FIG. 2, which is a block diagram of a second power amplifier 200 made according to the present invention. Power amplifier 200 has an input terminal 202, an amplifier 204, an output terminal 206, a positive half circuit 208 and a negative half circuit 210.

Input terminal 202 is configured to receive an input signal 230. Amplifier 204 is coupled to input terminal 202 to receive input signal 230 and to provide an amplified output signal 232 corresponding to input signal 230 at output terminal 206. A load 234 is coupled to output terminal 206 to receive output signal 232. Amplifier 204 receives power from a positive power input terminal 236.

Only the positive half circuit 208 of power amplifier 200 will be described in detail here. Positive half circuit 208 is operative to power amplifier 204 during positive half waves of output signal 232. Negative half circuit 210 has the same construction as positive half circuit 208 and has a complementary operation, providing power to amplifier 204 during negative half waves of output signal 232.

Positive half circuit 208 includes an input signal compensation block 205, a transient detect block 219, a control circuit 216, a power source 212, a main power supply 218, a transient power supply 223, a summer 237, and an output power signal compensation block 235. Input signal compensation block 105 includes an offset block 211, frequency compensation block 214 and a rectifier 215. Transient detect block includes a peak detector 220, a differentiator 222 and a comparator 255. Main power supply 218 is a switching regulator. Transient power supply 223 includes a switch 224 and a linear regulator 226. Output power signal compensation block 235 comprises an amplifier.

Offset block 211 is coupled to input terminal 202 to receive input signal 230. Offset block 211 adds a relatively small selected offset to input signal 230 to provide an offset input signal 231. Typically, the offset added by offset block 211 will be less than 10% of the expected 0-to-peak range of input signal 230 and is selected to ensure that the power provided to amplifier 204 by positive half circuit 208 is slightly higher than is actually required by amplifier 204 to generate output signal 232 (i.e. to ensure that $V_{targ}$ is slightly higher than $V_{req}$).

Frequency compensation block 214 is coupled to offset block 211 to receive offset input signal 231. Frequency compensation block 214 provides a frequency compensated signal 238 corresponding to offset input signal 231 to rectifier 215. Frequency compensation block 214 may be implemented as a phase lead network to (i) increase the amplitude of frequency compensated signal 238 at higher frequencies and to (ii) phase advance the voltage of frequency compensated signal 238 with respect to its current, as compared to the phase angle of input signal 230.

Rectifier 215 receives frequency compensated signal 238 and provides a corresponding half wave rectified signal 240 at terminal 217. Rectifier 215 is a half wave rectifier which essentially discards negative portions of frequency compensated signal 238. The negative portions frequency compensated signal 238 are not required in positive half circuit 208 since positive half circuit 208 provides power to amplifier 204 only during positive half waves of output signal 232.

Rectified signal 240, which is analogous to the compensated input signal 140 of power amplifier 100 (FIG. 1), corresponds to the magnitude of offset input signal 231, and therefore corresponds generally to the magnitude of output signal 232 and to the power required by amplifier 240 to generate output signal 232 during a positive half wave of input signal 230. The offset added to offset input signal 231 by offset block 211 results in rectified signal 240 reflecting a slightly higher power level than is actually required by amplifier 204.

Amplifier 204 receives a power signal $V_t$ from a positive amplifier power terminal 236. Power signal $V_t$ is the sum of a power signal $V_s$ provided by main power supply 218 and a power signal $V_l$ provided by transient power supply 223. Output power signal compensation block 235 is coupled to terminal 236 to receive power signal $V_t$ and provide a reduced power signal $V_{tr}$, which has a range comparable to rectified signal 240. Reduced power signal $V_{tr}$ has the same magnitude as rectified signal 240 when power signal $V_t$ is providing sufficient power for amplifier 204 to generate the required output signal 232 with approximately the headroom configured by offset block 211.

Summer 237 receives rectified signal 240 and subtracts reduced power signal $V_{tr}$ to provide an error signal 239. At any point in time, error signal 239 represents the difference between the power required by amplifier 204 to produce output signal 232 (i.e. as represented by rectified signal 240) and the power presently being supplied to amplifier 204 (i.e. power signal $V_t$).

Control circuit 216 is coupled to summer 237 to receive error signal 239. Control circuit 216 provides a first control signal 242 at a first control terminal 241 and a second control signal 244 at a second control terminal 243 in response to error signal 239. In power amplifier 200, control signal 242 is a pulse width modulated (PWM) control signal.

Main power supply 218 is coupled to power source 212 to receive electrical power. Power source 212 has an output voltage of $V_{max}$. Main power supply 218 is a switching regulator and includes a switch 246 and a diode 248. Switch 246 is coupled to control terminal 241 and is responsive to PWM control signal 242 to produce a power signal $V_{si}$. Diode 248 ensures that current may flow in main power supply 218 at all times (i.e. when switch 246 is open, current may flow from ground through diode 248). Main power supply 218 also includes an integrating LC filter 250, which smooths power signal $V_{si}$ to produce power signal $V_s$, which is delivered to positive power terminal 236 through diode 251.

Amplifier 204 receives power signal $V_s$ from positive power terminal 236. Amplifier 204 requires sufficient power $V_{req}$ to produce output signal 232 and to power the components of amplifier 204 itself. Due to the small offset added by offset block 211, error signal 239 indicates that a slightly larger power signal is required by amplifier 204 than the power $V_{req}$ that is actually required. As a result, control circuit 216 sets control signal 242 such that main power supply 218 will produce a power signal $V_{targ}$, which is slightly higher than the power $V_{req}$ required by amplifier 204. Amplifier 204 will therefore ideally have a headroom equal to $V_{targ}-V_{req}$.

Due to the phase lead effect of frequency compensation block 214, rectified signal 240 and control signal 242 will be advanced compared to the time at which amplifier 204 will actually receive the corresponding part (i.e. the current) of input signal 230. As a result, main power supply 218 will begin to shift its output power signal $V_s$ to the power level $V_{req}$ required by amplifier 204 before amplifier 204 actually requires that level of power. In this way, the phase lead effect of frequency compensation block 214 gives main power supply 218 more time to respond to changes in the power level required by amplifier 204 to produce output signal 232. A similar predictive effect could be achieved by removing frequency compensation block 238 and differentiating rectified signal 240 with respect to time before it is fed to summer 239. This approach would result in a change in the waveform of the output power signal $V_s$ of main power supply 218 since rectified signal 240 is not a sinusoidal signal.

The small excess power (i.e. the headroom) in power signal $V_s$ ($V_{targ}-V_{req}$) is dissipated in amplifier 204. Ideally, the excess power in power signal Vs would be zero or almost zero, although such an ideal result cannot practically be achieved. One reason for this is that power signal $V_s$ will exhibit some degree of ripple. Power signal $V_{si}$ is produced by the operation of switch 246 and will accordingly have a fairly high degree of ripple and may actually have substantial high frequency components. Filter 250 operates to integrate power signal $V_{si}$ and smooth it thereby producing power signal $V_s$. However, power signal $V_s$ will still exhibit some ripple, and it is necessary to ensure that even when the ripple causes power signal $V_s$ to be below $V_{targ}$, it is still sufficient to power amplifier 204. For example, if output signal 232 has a magnitude of 10 volts at a particular point in time and exhibits a symmetrical ripple of 5 volts, then $V_{targ}$ must be set to at least 12.5 volts so that even when power signal $V_s$ is at it lowest level (during that particular time), which will be 12.5–2.5 volts, it will provide sufficient power to amplifier 204. More practically, in this example, $V_{targ}$ may be set to 13.5 volts or more to provide an additional safety margin, to accommodate for the voltage drop across diode 251 and to provide power for the components of amplifier 204.

The combination of the effect of offset block 211 and the phase lead effect of frequency compensation block 214 is to configure main power supply 218 to produce a power signal $V_s$ which has a slightly higher magnitude than is required by amplifier 204, and which is generally matched in time to the power needs of amplifier 204. A person skilled in the art will be capable of adjusting the offset added by offset block 211 and the magnitude of the phase lead effect of frequency compensation block 214 to provide an appropriate power signal $V_s$.

When the frequency of input signal 230 is relatively low, power signal $V_s$ will follow the waveform of output signal 232, with some headroom. As the slew rate of input signal 230 rises, main power supply 218 may be unable to change the magnitude of power signal $V_s$ sufficiently quickly to follow output signal 232, which will have a correspondingly high slew rate. (Main power supply 218, which is a switching power regulator, has an intentionally limited slew rate, which is discussed below, increasing the possibility that this will occur.) When this occurs, power signal $V_s$ will follow the envelope of output signal 232. However, due to the slow slew rate of main power supply 218 and the high slew rate of the output signal 232, power signal $V_s$ may not have any headroom between it and the envelope of output signal 232. In fact, power signal $V_s$ may be able to follow only the average of the envelope of output signal 232 and may actually be lower than output signal 232 at times, and may therefore be insufficient to power amplifier 204.

As mentioned above, frequency compensation block 214 increases the amplitude of frequency compensated signal 238 at higher frequencies. As a result, when higher frequencies are present in input signal 230, rectified signal 240 will be magnified in comparison to input signal 230, and therefore, control circuit 216 will regulate main power supply 218 to a higher target power level $V_{targ}$. If the increased amplitude of frequency compensated signal 238 at high frequencies is sufficient, then main power supply 218 may provide a sufficient power signal $V_s$ to power amplifier 204.

Another mechanism for ensuring that main power supply 218 produces a power signal $V_s$ that is sufficient to power amplifier 204 may be incorporated into offset block 211. In power amplifier 200, offset block 211 adds a fixed offset to input signal 230 to produce offset fixed signal 231. In an alternative embodiment of a power amplifier according to the present invention, offset block 211 may be configured to detect the frequency components on input signal 230 and to add a smaller offset to input signal 230 if the highest frequency component is lower than a selected frequency and to add a larger offset to input signal 230 if frequency components exceeding equal to or exceeding the selected frequency exist. This will result in a larger power signal $V_s$ when input signal 230 has frequency components higher than the selected frequency, thereby providing a higher headroom between the required power level $V_{req}$ and the target power level $V_{targ}$.

One skilled in the art will recognize that in power amplifier 200, the addition of a fixed offset to input signal 230 will cause a part of each negative half wave of input signal 230 (immediately before the beginning and after the end of each positive half wave) to have a magnitude greater than 0, which then results in that part of each negative half wave being treated as part of a positive half wave of input signal 230. Conversely, the complementary operation of negative half circuit 210 will cause similar parts of the positive half wave of input signal to be treated as part of the negative half waves. This may be acceptable and even preferable depending on the desired performance of a power amplifier according to the present invention. If this is not desired, offset block 211 may be coupled to the output of rectifier 215 to allow rectifier 215 to remove all parts of each negative half wave. Offset block 211 will then add the fixed offset to rectified signal 240.

Returning to a description of power amplifier 200, main power supply 218 will emit some electro-magnetic radiation, which produces electro-magnetic interference (EMI) in nearby electronic devices. As is well understood, the amount of EMI produced by a switching regulator such as main power supply 218 depends on its switching rate. In order to reduce EMI, the switching rate of switch 246 is reduced by selecting a relatively low frequency for PWM control signal 242. The precise frequency chosen for PWM control signal 242 (which is a fixed frequency signal) will depend on the characteristics of load 234, output signal 232 and energy which must be delivered to properly power amplifier 204, among other criteria. A person skilled in the art will be capable of selecting a suitable frequency to balance these considerations with the need to reduce EMI emissions in a particular implementation of the present invention. Reducing the frequency of PWM control signal 242 and the switching rate of switch 246 has several effects.

First, it increases the ripple in power signal $V_{si}$. To counteract this effect, the time constant of LC filter 250 is increased so that power signal $V_s$ will be effectively smoothed despite the relatively low frequency at which switch 246 is operated.

Second, the rate at which the magnitude of power signal $V_s$ can rise or fall (i.e. the slew rate of power signal $V_s$) is reduced. If input signal 230 has a rapid increase in magnitude, amplifier 204 will require a rapid increase in its power supply to properly generate output signal 232 (i.e. $V_{targ}$ will rise rapidly). Due to its slow slew rate, main power supply 218 may be unable to increase the magnitude of power signal $V_s$ sufficiently quickly to power amplifier 236. Eventually, power signal $V_s$ will rise to $V_{targ}$, up to a maximum of $V_{max}$ volts. However, this will take a finite time.

During this finite time period, additional power is provided by transient power supply 223 to amplifier 204 as follows. Transient detect block 219 operates to provide a digital transient signal 257. Peak detector 220 is coupled to rectifier 215 to receive rectified signal 240. Peak detector 220 provides a peak signal 252 corresponding to the peak envelope of the rectified signal 240 to differentiator 222. Differentiator 222 differentiates peak signal 252 to provide a differentiated signal 254. The magnitude of differentiated signal 254 at any point in time is indicative of the rate at which input signal 230 is changing. Comparator 255 compares differentiated signal 254 with a threshold voltage 256 to provide transient signal 257. When differentiated signal 254 exceeds threshold 256, transient signal 257 is high; otherwise, it is low.

Switch 224 is responsive to transient signal 257 to selectively connect control circuit 216 to linear regulator 226.

Linear regulator 226 may be a power MOSFET. The drain of linear regulator 226 is connected to power source 212 and the source of linear regulator 226 is connected to positive power input terminal 236. The gate of linear regulator 226 is connected to a terminal a of switch 224. Terminal b of switch 224 is coupled to control circuit 216 and terminal c of switch 224 is coupled to ground.

When transient signal 257 is high, switch 224 engages transient power supply 224 by coupling the gate of linear regulator 226 to control terminal 243 (i.e. terminal a is coupled to terminal b). At all other times, switch 224 couples the gate of linear regulator 226 to ground (i.e. terminal a is coupled to terminal c).

Like control signal 242, control signal 244 is set by control circuit 216 so that transient power supply 223 will produce power signal $V_l$ equal to $V_{targ}$. (It may be desirable to make power signal $V_l$ slightly lower than power signal $V_s$. This is discussed further below.) Also, control signal 244 will be advanced compared to the time at which amplifier 204 will actually require the power level indicated by control signal 244. Control signal 244 is an analog signal, as opposed to control signal 242, which is a PWM signal.

When the gate of linear regulator 226 is coupled to control terminal 243, it receives control signal 244. Linear regulator 226 is responsive to control signal 244 to provide power signal $V_l$ to positive power input terminal 236. Linear regulator 226 has a very fast slew rate, and therefore its power signal $V_l$ rises quickly to $V_{targ}$.

Eventually, the magnitude of power signal $V_s$ will rise to $V_{targ}$. At this point, power signal $V_s$ will be sufficient to separately power amplifier 204. Until this time, it is necessary for switch 224 to keep transient power supply 223 engaged. The period for which switch 224 must remain in this state will depend on the slew rate of main power supply 218 and on the rate of change of input signal 230. The slew rate of main power supply 218 may be calculated (or more likely, the slew rate may be pre-determined based on the maximum EMI that power amplifier 200 is permitted to emit and then main power supply 218 may be designed to have the selected slew rate). Threshold 256 is selected to correspond to this slew rate, so that main power supply 223 will be kept engaged by switch 224 until power signal $V_s$ is able to rise to $V_{targ}$.

Once transient power supply 223 is disengaged, it is important that peak detector 220 and differentiator 222 operate properly to ensure that linear regulator 224 may be engaged again if input signal 230 has another rapid rise in magnitude. This may be done by setting the discharge rate of peak detector 220 to correspond to the slew rate of main power supply 218 (which will depend on time constant of filter 250 and will also be affected by delays through the feedback network comprising amplifier 235, summer 237 and control circuit 216). This will ensure that the magnitude of peak signal 252 will fall as fast as power signal $V_s$, and will ensure that differential signal 254 will exceed threshold 256 when input signal 230 rises too quickly for main power supply 218 to supply enough power to amplifier 204. Furthermore, this will also ensure that differential signal 254 will not fall below threshold 256 too quickly, causing linear regulator 226 to be disengaged before power signal $V_s$ has risen to $V_{targ}$.

As noted above, control signals 242 and 244 are set so that main power supply 218 and linear regulator 226 will provide power signals $V_s$ and $V_l$ of approximately the same magnitude ($V_{targ}$). This ensures that power signal $V_t$ will have a smooth transition when linear regulator 226 is engaged by the operation of switch 224. When main power supply 218 is unable to raise its output power signal $V_s$ sufficiently to power amplifier 204, differentiated signal 254 will exceed threshold 256. Very quickly thereafter, switch 224 will engage transient power supply 223. Since transient power supply 223 is configured to produce the same power signal $V_{targ}$ as main power supply 218, and since linear regulator 226 is engaged very quickly after main power supply 218 becomes unable to produce the configure power signal $V_{targ}$, engaging transient power supply 223 will not cause a substantial jump in the total power signal $V_t$ supplied to amplifier 204. Similarly, when transient power supply 223 is disengaged (when differentiated signal 254 falls below threshold 256), both transient power supply 223 and main power supply 218 will be generating the same power signal $V_{targ}$ (i.e. $V_s = V_l = V_{targ}$). As a result, there will be a smooth transition in $V_t$ when transient power supply 223 is switched off.

Control signal 244 cannot be configured to produce a power signal $V_l$ with a larger magnitude than power signal $V_s$ (i.e. $V_l$ cannot be larger than $V_{targ}$). If this occurs, power signal $V_s$ produced by main power supply 218 may not reach $V_{targ}$ before transient power supply 223 is disengaged, and therefore, may not be able to power amplifier 204 at that time. If power signal $V_l$ exceeds the level to which main power supply 218 is being regulated by control signal 242 (i.e. $V_l$ exceeds $V_{targ}$), then the magnitude of power signal $V_t$ will be equal to the magnitude of power signal $V_l$. Since $V_t$ exceeds $V_{targ}$, error signal 239 will indicate that $V_{targ}$ may be lowered. Control circuit 216 will accordingly set control signal 242 to reduce power signal $V_s$. Accordingly, control circuit 216 must ensure that control signal 242 remains constant when transient power supply 223 is engaged. This may be done by setting control signal 244 to operate linear regulator 226 to produce power signal $V_l$ with a slightly smaller magnitude than power signal $V_s$ produced by main power supply 218 under the control of control signal 242 (i.e. $V_l$ may be slightly lower than $V_{targ}$). Although this will cause a small transition in power signal $V_t$ whenever transient power supply 223 is engaged, it will not have a substantial effect when transient power supply 223 is disengaged.

Power amplifier 200 provides an efficient circuit for receiving input signal 230 to provide an amplified output signal 232. Amplifier 204, which performs the amplification of input signal 230, receives power from main power supply 218 and from linear regulator 226. At most times, amplifier 204 receives power only from main power supply 218 and transient power supply 223 is disengaged by grounding its control terminal (i.e. its gate). The power output signal $V_s$ of main power supply 218 is configured to follow and slightly exceed the power $V_{req}$ required by amplifier 204 to generate output signal 232. This reduces power dissipation in amplifier 204 and the overall power consumption of power amplifier 200. The switching frequency of main power supply 218 is kept intentionally low to reduce EMI generation. This causes main power supply 218 to have a slow slew rate and main power supply 218 may not be able to provide sufficient power to amplifier 204 to produce output signal 232. When such a condition occurs, transient power supply 223 is engaged. Transient power supply 223 has a fast slew rate, allowing it to quickly provide the power $V_{req}$ required by amplifier 204 to produce output signal 232. Transient power supply 223 is kept engaged for a period sufficient to allow main power supply 218 to increase its power supply signal $V_s$ to $V_{req}$, and then transient power supply 223 is disengaged.

Figure 3:
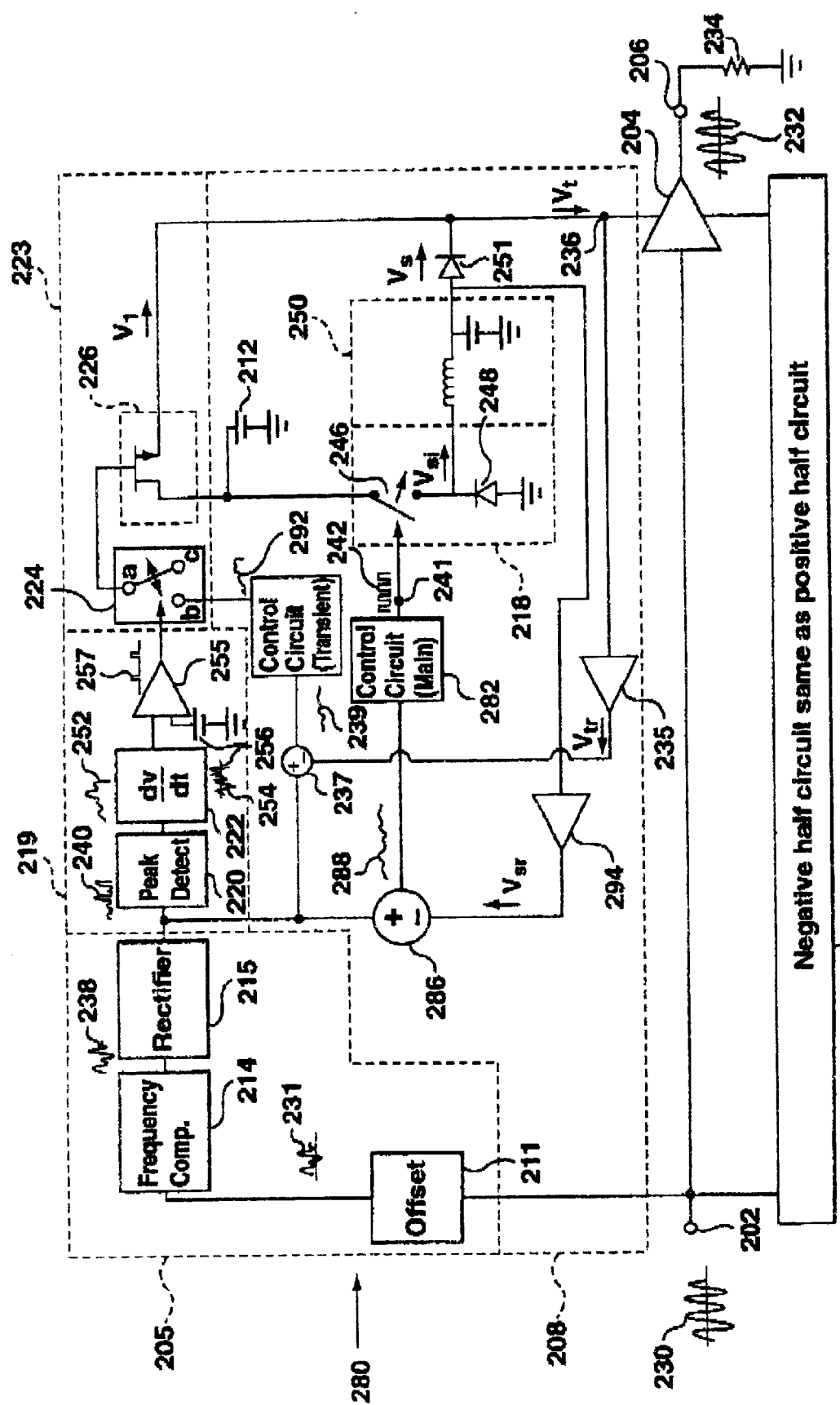
FIG. 3 illustrates a third embodiment of a power amplifier according to the present invention.

Reference is next made to FIG. 3, which is a block diagram of a third power amplifier 280 according to the present invention. Power amplifier 280 is similar to power amplifier 200 except that the control signals for main power supply 218 and transient power supply 223 are generated by separate control circuits. In addition to the components of power amplifier 200, power amplifier 280 has a first control circuit 282, a second control circuit 283, an amplifier 294 and a summer 286.

Amplifier 294 is coupled to main power supply 218 to receive power signal $V_s$. Amplifier 294 reduces the range of power signal $V_s$ and produces a reduced power signal $V_{sr}$, which has a range comparable to that of rectified signal 240. Summer 286 is coupled to rectifier 215 and to amplifier 294 to receive rectified signal 240 and reduced power signal $V_{sr}$. Summer 286 produces an error signal 288 which indicates the difference between the power $V_{req}$ required to produce output signal 232 (i.e. as represented by rectified signal 240) and the power signal $V_s$ being supplied by main power supply 218 to amplifier 204. Control circuit 282 is coupled to summer 286 to receive error signal 288. Control circuit 282 provides a PWM control signal 290 in response to error signal 288 to control switch 246 of main power supply 218.

Amplifier 235 is coupled to terminal 236 to receive power signal $V_t$ and operates as in power amplifier 200 to produce reduced power signal $V_{tr}$. Summer 237 is coupled to rectifier 215 to receive rectified signal 240 and to amplifier 235 to receive reduced power signal $V_{tr}$ and operates as in power amplifier 200 to produce error signal 239. Control circuit 284 receives control signal 239 and produces an analog control signal 292, which is similar to control signal 244 of power amplifier 200. Switch 224 may couple control signal 292 to the gate of linear regulator 226, when transient power supply 223 is required to supply power signal $V_l$ to amplifier 204, in the same manner as described above in relation to power amplifier 200. Power signals $V_l$ and $V_s$ are diode OR'd through diode 251 to produce power signal $V_t$.

By generating control signals 290 and 292 separately through independent feedback paths and control circuits 282 and 284, respectively, main power supply 218 and transient power supply 223 may be independently controlled. In particular, by referencing control signal 290 to the output of main power supply 218 only, it is not necessary to ensure that power signal $V_l$ does not exceed the voltage $V_{targ}$ to which main power supply 218 is being regulated, as is required in the case of power amplifier 200.

Figure 4:
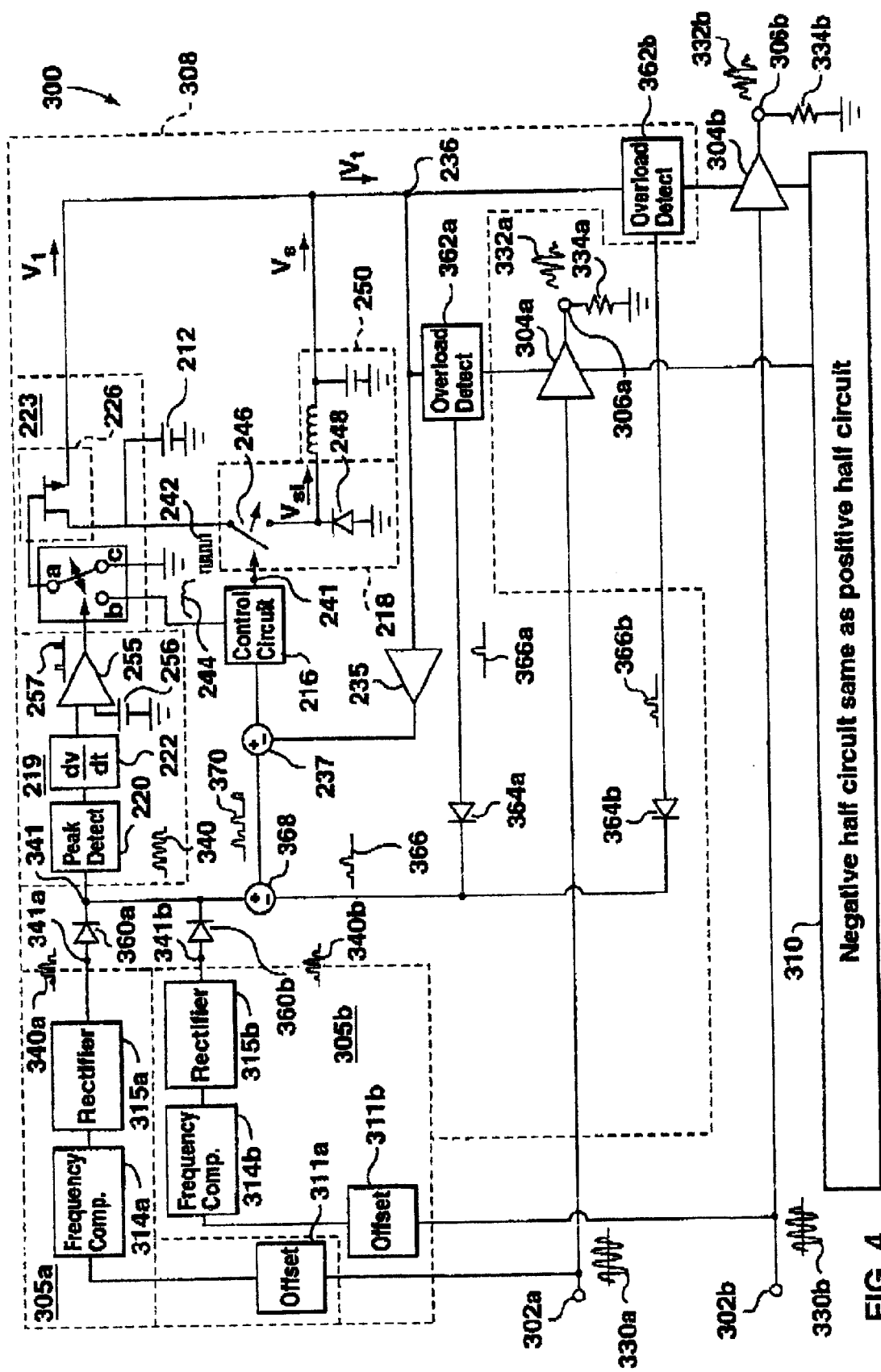
FIG. 4 illustrates a fourth embodiment of a power amplifier according to the present invention.

Reference is next made to FIG. 4, which illustrates a fourth power amplifier 300 according to the present invention. Power amplifier 300 illustrates the use of a power amplifier based on power amplifier 200 to power several channels simultaneously. Power amplifier 300 also illustrates the use of overload detectors to protect the amplifiers of power amplifier 300.

Power amplifier 300 has two input terminals 302a, 302b, two amplifiers 304a, 304b, a positive half circuit 308 and a negative half circuit 310. Power amplifier 300 is configured to amplify input signals 330a and 330b, which are received at input terminals 302a and 302b, respectively. Input signals 330a and 330b are two separate input signals and may be two channels in an audio system. For example, input signals 330a and 330b may be the left and right channels in a standard audio system.

Amplifiers 304a and 304b are coupled to input terminals 302a and 302b to receive input signals 330a and 330b. Amplifier 304a and 304b provide amplified output signals 332a and 332b, which correspond to input signal 302a and 302b, to loads 334a and 334b.

Offset block 311a, frequency compensation block 314a and rectifier 315a, which comprise a first input signal compensation block 305a, are coupled to input terminal 302a in the same manner as offset block 211, frequency compensation block 214 and rectifier 215 are coupled to input terminal 202 of power amplifier 200. Rectifier 315a provides a rectified signal 340a corresponding to input signal 330a at terminal 341a. Similarly, offset block 311b, frequency compensation block 314b and rectifier 315b, which comprise a second input signal compensation block 305b, are coupled to input terminal 302b and rectifier 315b provides a rectified signal 340b corresponding to input signal 330b at terminal 341b. Terminals 341a and 341b are coupled to terminal 341 through diodes 360a and 360b. Rectified signals 340a and 340b are diode-OR'd by diodes 360a and 360b, providing a rectified signal 340 at terminal 341, which corresponds generally to either the highest magnitude of signals 330a and 330b at any particular time. Offset blocks 311 and 311b may be configured to compensate for the diode drops caused by diodes 360a and 360b in rectified signals 340a and 340b.

Rectified signal 340 generally corresponds to highest of the power levels required by either amplifier 304a or 304b to produce output signal 332a or 332b. Summer 368 receives rectified signal 340 and a combined overload detect signal 366, which is explained below and provides an adjusted rectified signal 370, which is used to produce power signal $V_t$ at positive power input terminal 236 in the same manner as rectified signal 240 is used in power amplifier 200.

Amplifier 304a is coupled to power input terminal 236 through an overload detect block 362a. Amplifier 304a receives power signal $V_t$ and provides output signal 332a. Similarly amplifier 304b is coupled to power input terminal 236 through an overload detect block 362b and provides output signal 332b. Overload detect blocks 362a and 362b are configured to detect overload conditions in their associated amplifiers 304a and 304b. For example, overload detect blocks 362a and 362b may be configured to detect over-current, over-temperature or other overload conditions. If overload detect block 362a detects such a condition in its associated amplifier 304a, then overload detect block 362a will produce an overload signal 366a, which corresponds to the magnitude of the overload condition detected. Similarly, overload detect block 362b will produce an overload signal 366b if an overload is detected in amplifier 304b. Overload signals 366a and 366b are diode OR'd through diodes 364a and 364b to produce a combined overload signal 366, which is subtracted from rectified signal 340 to produce adjusted rectified signal 370. Adjusted rectified signal 370 is used to control the magnitude of power signal $V_t$. In this way, overload detect blocks 362a and 362b operate to reduce power signal $V_t$ to protect amplifiers 304a and 304b when an overload occurs.

Since input signals 330a and 330b are independent of one another, they may have different magnitudes at any point in time. Accordingly, output signals 332a and 332b will have different amplitudes and amplifiers 304a and 304b will have different power requirements. Power signal $V_t$ is large enough to power the amplifier 304a or 304b with the largest power requirement at any particular time (assuming that no overload condition exists). As a result, one of the amplifiers will receive more power than it requires and will dissipate the excess power.

Figure 5:
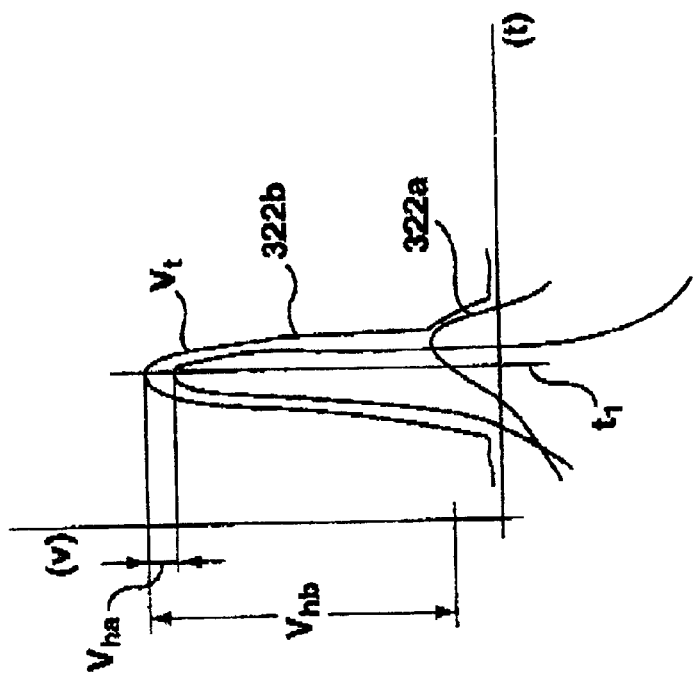
FIG. 5 illustrates the headroom between a power supply signal of the power amplifier of FIG. 4 and a pair of input signals to that power amplifier.

It has been found that the dissipation of this excess power in one of the amplifiers 304a or 304b does not substantially reduce the average efficiency of power amplifier 300. Reference is made to FIG. 5, which shows output signals 332a and 332b and power signal $V_t$. In the portion of the signals shown, output signal 332b is experiencing a peak at time $t_1$. Output signal 322a is at a typical or average level. A typical audio signal, such as a movie soundtrack or music, may have a peak-to-average magnitude ratio of 8:1 or higher. At time $t_1$, output signal 332a may have a current of 2 amps and a magnitude of 5 volts while output signal 332b may have a current of 14 amps and a magnitude of 35 volts. (Output signal 332b has 49 times more power than output signal 332a). Typically, output signal $V_t$ may have an average magnitude of 41 volts (which is selected to account for any ripple in output signal $V_t$, to power the components of both amplifiers 204a and 204b and to provide reasonable headroom in the amplifier 204a or 204b with the higher power requirements) when amplifiers 304a and 304b are called on to produce these output signals 332a and 332b. Accordingly, output signal 332a has a headroom of 36 volts and will dissipate 72 watts of power (i.e. 36 volts×2 amps). Output signal 332b has a headroom of 6 volts and will dissipate 84 watts (i.e. 6 volts×14 amps). Amplifier 304b will therefore actually exhibit a high power loss, even though amplifier 304a has a much larger headroom. As a result, the large headroom created in amplifier 304a due to the peak of output signal 304b does not substantially increase the average power dissipated by power amplifier 300 in comparison to the power dissipated in amplifier 304b at the same time. Furthermore, peaks in a typical musical selection or a movie soundtrack occur relatively infrequently (and often occur on several channels simultaneously) and since the average level of a typical selection is generally less than ⅛th the level of the peaks in the selection, sharing main power supply 218 and transient power supply 223 between more than one amplifier does not result in a substantial change in the overall efficiency of power amplifier 300.

Power amplifier 300 allows main power supply 218 and transient power amplifier 223 to be shared between two channels having separate inputs, amplifiers and outputs. The design of power amplifier 300 is not limited to two channels and may be used to power any number of channels. For example, power amplifier 300 could be adapted to power 6 or more channels simultaneously for use with a typical "surround sound" soundtrack for a movie, which may have 5 or more audio channels and 1 or more additional subwoofer channels.

Figure 6:
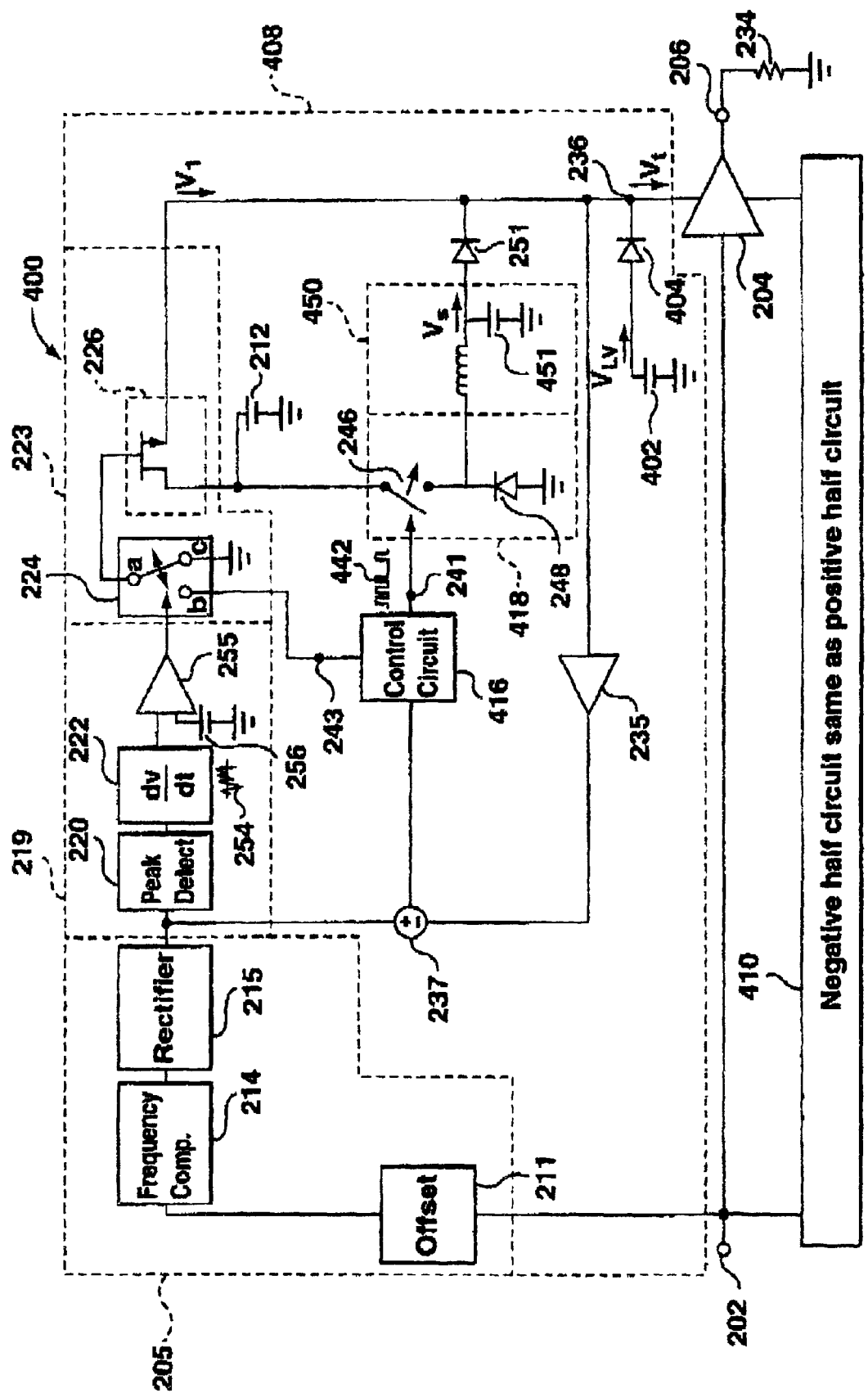
FIG. 6 illustrates a fifth embodiment of a power amplifier according to the present invention.

Reference is next made to FIG. 6, which illustrates a fifth embodiment of a power amplifier 400 according to the present invention. Power amplifier 400 is similar to power amplifier 200. Power amplifier 400 has an input terminal 202, an amplifier 204, an output terminal 206, a positive half circuit 408 and a negative half circuit 410. In addition to the structure defined above in relation to positive half circuit 208 of power amplifier 200, positive half circuit 408 includes a low voltage power supply 402 and a diode 404. Control circuit 216 of power amplifier 200 has been replaced with control circuit 416. Main power supply 218 of power amplifier 200 has been replaced with main power supply 418, which is a switching power regulator with an LC filter 450.

Reference is briefly made to FIG. 2. As noted above, the switching speed of main power supply 218 is kept intentionally low to reduce the amount of EMI generated by main power supply 218. To reduce the amount of ripple in power signal $V_s$ (as compared to the relatively large ripple in power signal $V_{si}$), the time constant of filter 250 is increased. Although this provides a smoother power signal $V_s$, it also further reduces the slew rate of main power supply 218, thereby preventing power signal $V_s$ from closely following output signal 232.

Referring again to FIG. 6, it is therefore desirable to decrease the time constant of filter 450 to allow power signal $V_s$ to follow the output signal 232 closely. This has the disadvantage that the ripple produced in power signal $V_{si}$ may not be effectively removed from power signal $V_s$. Depending on the time constant of filter 250, the ripple in power signal $V_s$ may be quite large. The selection of an optimal time constant will depend on the nature of input signal 230, the desired efficiency of power amplifier 400 and the desired EMI emission level for power amplifier 400. The selection of a low time constant for filter 450 has three adverse consequences.

First, when the magnitude of power signal $V_s$ is relatively low, the ripple in power signal $V_s$ will produce a proportionally large amount of energy to be stored in (and later dissipated from) capacitor 451 of filter 450. The magnitude of the ripple in power signal $V_s$ will be relatively constant regardless of the magnitude of power signal $V_s$. The energy stored in capacitor 451 is equal to ½ $CV_s^2$. When power signal $V_s$ has a relatively low magnitude (which will be the case much of the time, since peaks in a typical music signal are relatively infrequent), the ripple in power signal $V_s$ will be relatively large, and will therefore cause a proportionally larger excess amount of energy to be stored in capacitor 451 during each pulse created in power signal $V_{si}$ by the closing and opening of switch 246. This excess energy is later dissipated and is essentially wasted. This increases the power consumption of power amplifier 400.

Second, the difference between the voltage to which power signal $V_s$ is regulated ($V_{targ}$) and the voltage required by amplifier 204 to produce output signal 230 must be increased to ensure that power signal $V_s$ is sufficient at all times to power amplifier 204. The increased average headroom between power signal $V_s$ and the power $V_{req}$ required by amplifier 204 results in increased power dissipation in the amplifier 204 and a higher overall power consumption for power amplifier 400. This may be done by increasing the offset added into input signal 230 by offset block 211 or by modifying control circuit 216.

Third, the ripple in power signal $V_s$ may actually be coupled to output signal 232 through amplifier 204 and may be audible, depending on the frequency of the ripple (which in turn will depend on the frequency at which switch 246 is operated). To reduce the effect of this ripple on power signal $V_s$ when the magnitude of power signal $V_s$ is low, it may be desirable to eliminate the use of main power supply 418 when output signal 232 is relatively low.

This is accomplished by using low voltage power supply 402 when the magnitude of output signal 232 is relatively small. Low voltage power supply 402 is coupled to positive power supply terminal 236 and provides a fixed voltage DC power signal $V_{LV}$ to amplifier 204 at all times. Power signal $V_{LV}$ is diode-OR'd with power signal $V_s$ and power signal $V_t$ through diodes 404 and 251. In power amplifier 400, at any particular time, power signal $V_t$ delivered to positive power input terminal 236 is equal to the highest of power signals $V_t$, $V_s$ and $V_{LV}$.

Control circuit 416 of power amplifier 400 may be configured to keep switch 246 open when the magnitude of output signal 232 is less than the magnitude of power signal $V_{LV}$. This may be done by setting control signal 442 to 0 during these periods and it effectively eliminates the proportionally high energy loss which would otherwise occur when power signal $V_s$ has a low magnitude. Furthermore, this eliminates the generation of EMI by switching regulator 232 during these periods when it is effectively disengaged.

Control circuit 416 will be able to determine when to engage and disengage main power supply 418 based on error signal 239. Since power signal $V_t$ will have a minimum magnitude of $V_{LV}$, error signal 239 may be negative when input signal 230 is very small (and correspondingly amplifier 204 requires little power to generate output signal 230. When error signal 239 is negative (or below a selected threshold which may be built into control circuit 416), control circuit 416 will disengage main power supply 418.

Since power signal $V_{LV}$ has a fixed magnitude (even during negative half waves of input signal 230), it becomes the minimum magnitude that power signal $V_t$ can have. This does not substantially reduce the efficiency power amplifier 400 because the large ripple introduced into power signal $V_s$ by decreasing the time constant of main power supply 218 essentially forces power signal $V_s$ (and hence power signal $V_t$) to have a minimum average at least as large as one-half of the peak-to-peak magnitude of the ripple.

Figure 7:
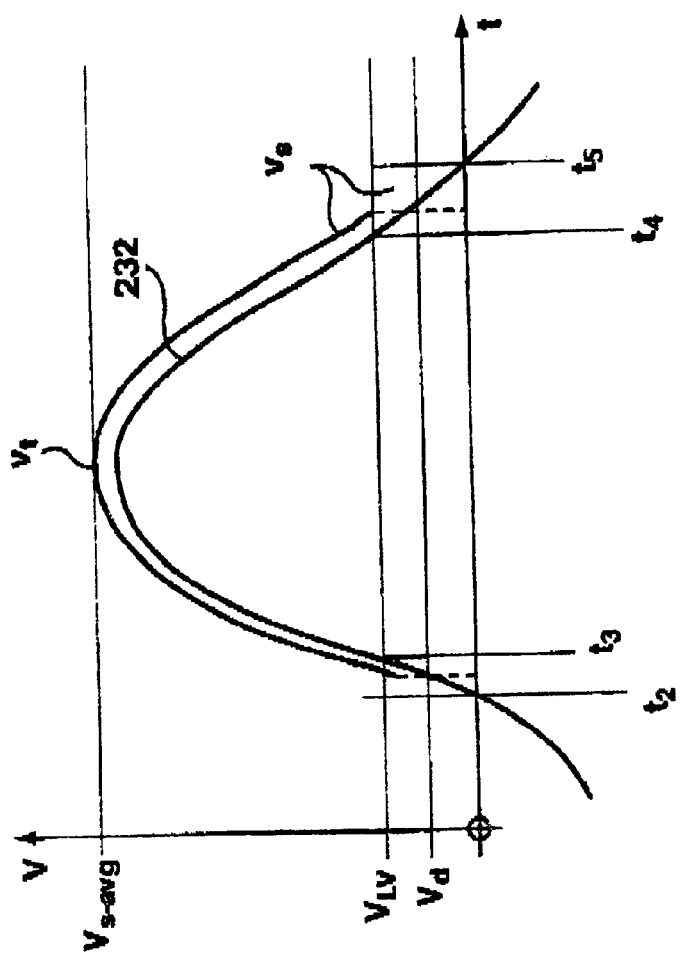
FIG. 7 illustrates the relationship between a power signal produced by a switching regulator and a low voltage power supply of the power amplifier of FIG. 6.

Reference is made to FIG. 7, which illustrates an average positive half wave of output signal 232 and power signal $V_s$, $V_{LV}$ and $V_t$ during the corresponding period. The magnitude $V_{LV}$ of low voltage power supply 402 is selected to be a fraction of the average magnitude $V_{s-avg}$ of power supply $V_s$ during periods when output signal 232 is at an average level (i.e. a period during which no peaks occur). During such periods, transient power supply 223 will generally not be engaged. During the period shown in FIG. 7, transient power supply 223 is disengaged. Between times $t_2$ and $t_3$ and between times $t_4$ and $t_5$, the magnitude of output signal 232 is less than the magnitude of power signal $V_{LV}$ and power signal $V_t$ is equal to power signal $V_{LV}$. As noted above, control circuit 216 may be configured to disengage main power supply 418 by setting control signal 442 to 0. In power amplifier 400, control circuit 416 is configured to disengage main power supply 418 when the magnitude of output signal 232 is less than a selected threshold $V_d$. When the magnitude of output signal 232 approaches threshold $V_d$, main power supply 418 is engaged by control circuit 416 to produce power signal $V_s$. Threshold $V_d$ must be selected to ensure that main power supply 418 is engaged whenever: power signal $V_{LV}$ would be insufficient to power amplifier 204 to produce output signal 232. In selecting threshold $V_d$, the desired headroom (defined above as $V_{targ}$-$V_{req}$) must be taken into account. When main power supply 418 is engaged, power signal $V_t$ will be equal to the higher of power signal $V_{LV}$ and $V_s$.

The use of low voltage power supply 402 in power amplifier 400 allows a filter 450 with a relatively short time constant to be used, allowing power signal $V_s$ (and consequently power signal $V_t$) to more closely follow output signal 232 than is possible in power amplifier 200. Furthermore, the use of low voltage power supply 402 allows main power supply 418 to be disengaged during periods when it would have a large proportional power loss and would generate relatively high EMI emissions.

Reference is briefly made to FIG. 2. PWM control signal 242 consists of a series of pulses which may have differing pulse widths. The rising edges of successive pulses (assuming that a pulse is measured between a rising edge and a falling edge) are spaced apart by a fixed time period. Switch 246 is closed when PWM control signal 242 is high and switch 246 is open when PWM control signal 242 is low. The opening and closing operations of switch 246 produce an essentially square wave power signal $V_{si}$. Transitions in PWM control signal 242 occur without regard to the current flowing through switch 246. As a result, switch 246 may be opened while substantial currents are flowing through it, creating EMI emissions and high switching stresses and switching losses on the components on main power supply 218. (These currents are drawn by amplifier 204 to produce output signal 232.) These inefficiencies may be alleviated by opening and closing switch 246 only when the current being drawn from main power supply 218 is zero or almost zero.

Figure 8:
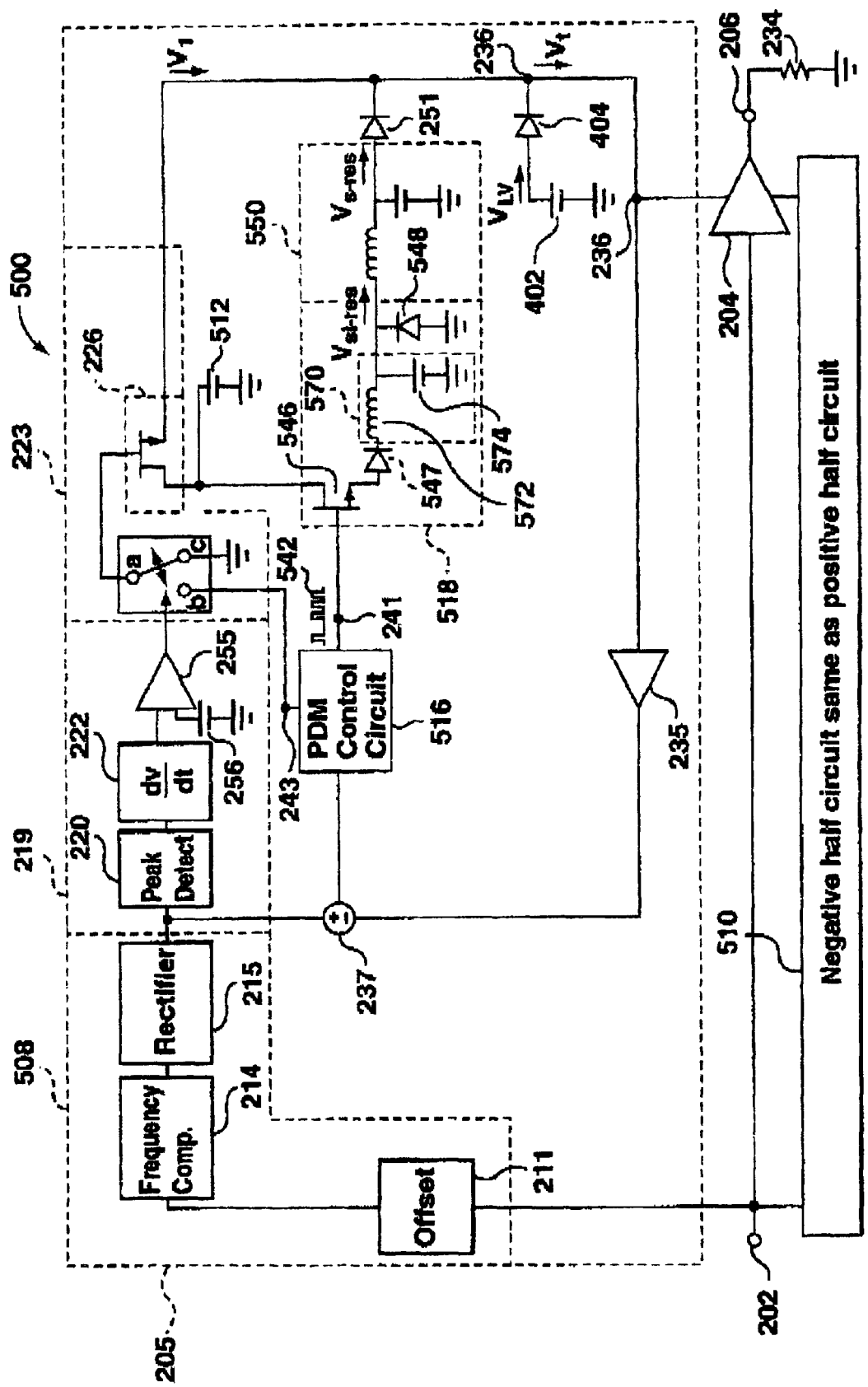
FIG. 8 illustrates a sixth embodiment of a power amplifier according to the present invention.

Reference is next made to FIG. 8 which is a block diagram of a sixth embodiment of a power amplifier 500 according to the present invention. Power amplifier 500 is similar to power amplifier 400, except for the configuration and structure of its control circuit 516 and main power supply 518. Power amplifier 500 has an input terminal 202 and an amplifier 204 which operate as in power amplifiers 200 and 400 to produce an output signal 232 at a terminal 206. Load 234, which may be a speaker, receives output signal 232. Power amplifier 500 also has a positive half circuit 508, which supplies power to amplifier 204 at a power terminal 236 during positive half waves of input signal 230, and a negative half circuit 510 which has the same structure as positive half circuit 508 and a complementary operation to supply power to amplifier 204 during negative half waves of input signal 230.

Positive half circuit 508 is similar to positive half circuit 408 of power amplifier 400, except that control circuit 416 has been replaced with a pulse density modulation (PDM) control circuit 516 and main power supply 418 has been replaced with a main power supply 518 which is a resonant switching power regulator. Main power supply 518 may be any type of resonant switching regulator such as a zero-current-switching (ZCS) converter, a zero-voltage-switching (ZVS) converter, a zero-voltage-switching quasi-resonant converter (ZVS-QRC), a zero-voltage-switching multi-resonant converter (ZVS-MRC), a constant-frequency, a zero-voltage-switching quasi-resonant converter (CF-ZVS-MRC). Such converters are described in U.S. Pat. No. 4,720,668, entitled "Zero Voltage Switching Quasi Resonant Converters" and in U.S. Pat. No. 5,479,337, entitled "Very Low Power Loss Amplifier for Analog Signals Utilizing Constant-Frequency Zero-Voltage Switching Multi-Resonant Converter". Such regulators have the advantage of lower EMI emissions and lower switching losses than the non-resonant main power supplies 218, 318 and 418 described above in respect of power amplifiers 200, 280, 300 and 400.

Main power supply 518 is a zero-current-switching (ZCS) switching regulator. Main power supply 518 includes a switch 546, diodes 547, 548 and a LC resonant tank 570 comprised of an inductor 572 and a capacitor 574, and an LC filter 550.

PDM control circuit 516 receives error signal 239 and provides a PDM control signal 542 at terminal 241 and second control signal 244 at terminal 243, which is the same as second control signal 244 provided by control circuit 216 of power amplifier 200. However, PDM control signal 542 is different from control signal 242, which is a pulse width modulated signal. Instead, PDM control signal 542 consists of a series of identical "high" pulses—each high pulse has an identical pulse length or a "constant on-time" (and an identical magnitude). After each pulse (i.e. after its falling edge), another pulse will not begin, and PDM control signal 542 will remain low, for a selected "minimum off-time". The pulses may be spaced apart by different periods, depending on the magnitude of the target power signal $V_{targ}$ needed to power amplifier 204 indicated by rectified signal 240. When a higher magnitude power signal is required, the time period between pulses is reduced, and vice versa. As a result, PDM control signal 542 has a "variable off-time" between pulses.

Main power supply 518 receives PDM control signal 542 and produces a power signal $V_{s-res}$ in response. Power signal $V_{s-res}$ is analogous to power signal $V_s$ produced by main power supply 218 of power amplifiers 200, 280, 300 and 400. Power signal $V_{s-res}$ is diode-OR'd with power signal $V_l$ and $V_{LV}$ to produce power signal $V_p$, which is received by amplifier 204 at terminal 236.

Switch 546 is preferably a MOSFET type transistor which receives PDM control signal 542. Alternatively, another semiconductor device such as an IGBT, BJT or an SCR may be used. Switch 546 is open (i.e. the MOSFET is "off") when PDM control signal 542 is low and is closed (i.e. the MOSFET is "on") when PDM control signal 542 is high. As is known, a MOSFET may conduct in both directions between its drain and its source when it is on and may allow current to flow from its source to its drain (typically considered the reverse direction) when it is off. Diode 547 is installed in series with switch 546 to prevent the flow of current in the reverse direction (i.e. from source to drain) of switch 546.

Figure 9:
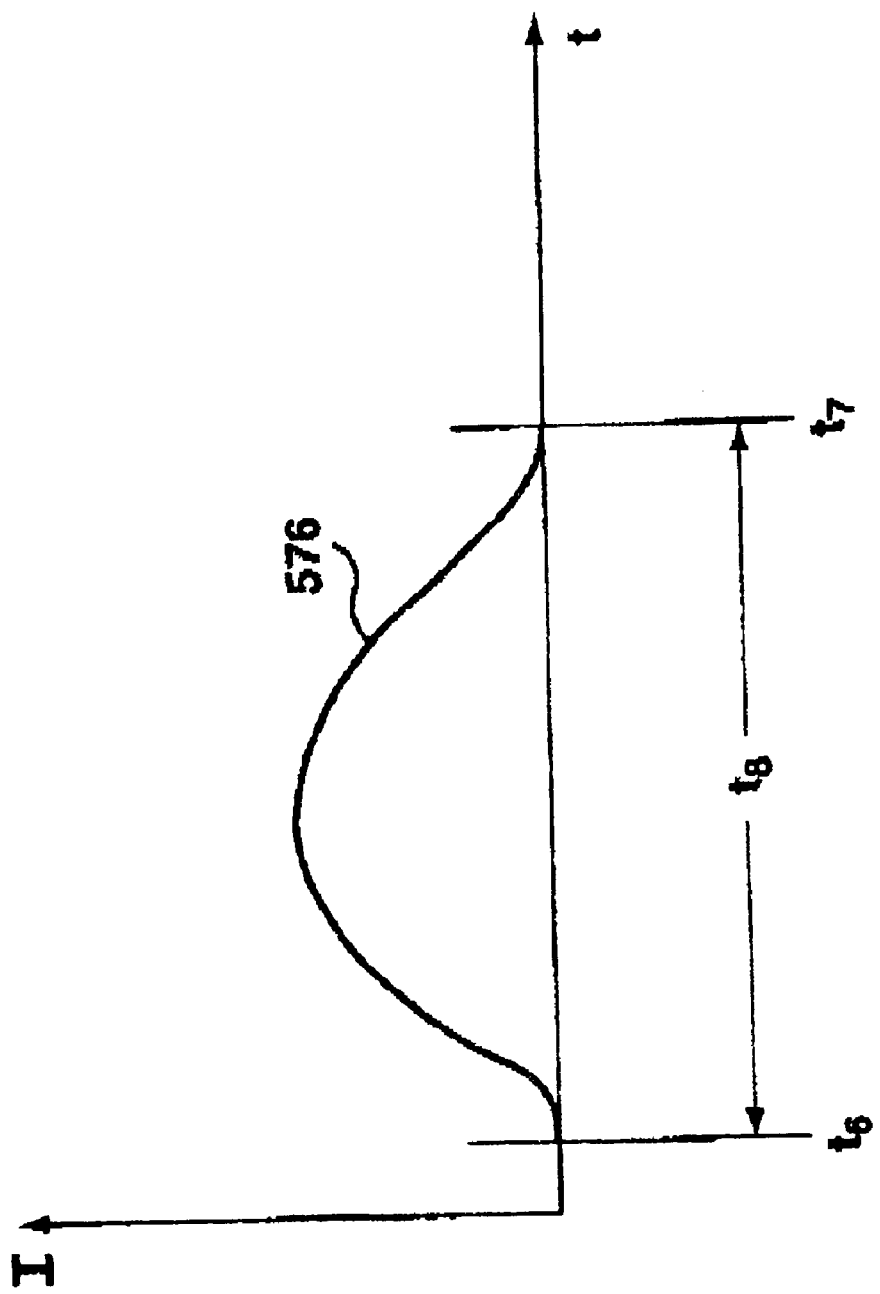
FIG. 9 illustrates a pulse of a power signal produced by a resonant switching regulator of the power amplifier of FIG. 8.

Reference is made to FIG. 9, which illustrates the current flowing in switch 546. If switch 546 is closed at a time $t_6$, LC resonant tank 570 causes a substantially sinusoidal pulse 576 to be produced at the cathode of diode 548. Sinusoidal pulse 576 begins at about time $t_6$ and ends at about time $t_7$, and lasts for a time period $t_8$. The length of time period $t_8$ depends on the values of inductor 572 and capacitor 574. Time $t_6$ may be determined in known manner by calculation or experimentation. At time $t_6$ and again at time $t_8$, the current in switch 546 is zero, and accordingly, by closing switch 546 at time $t_6$ and then opening switch 546 at time $t_7$, the EMI emissions and switching losses of switch 546 may be substantially reduced.

Figure 11:
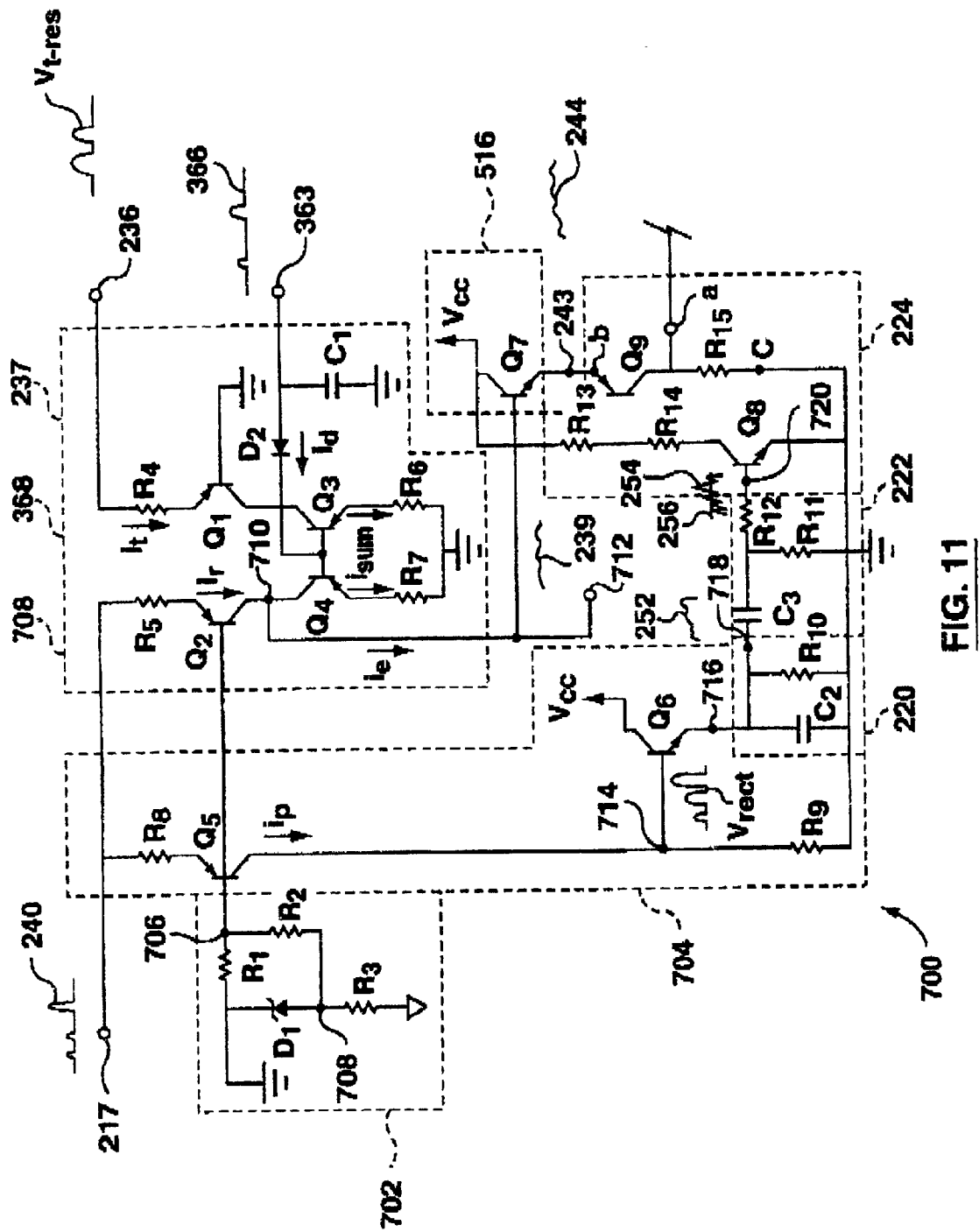
FIG. 11 illustrates part of the feedback control circuit of the power amplifier of FIG. 10.

The constant on-time of PDM control signal 542 is selected to exceed time period $t_8$, so that when switch 546 is opened at time $t_7$ (or later), switch 546 will essentially open a circuit which is carrying no current. During pulse 576, capacitor 574 will have become charged, and when switch 546 is opened, capacitor 574 will have no voltage across it but will have a charge on it. After switch 546 is opened, this charge is discharged into filter 550. The minimum off-time of PDM control signal 542 is selected to allow the charge on capacitor 574 to be essentially completely discharged. If the minimum off-time is too short, a charge will build up on capacitor 574 and the resonant operation of main power supply 518 will be degraded. The structure of PDM control circuit 516 is described below (FIG. 11).

Reference is again made to FIG. 8. As switch 546 opens and closes in response to PDM control signal 542, a series of pulses 576 are generated, forming a power signal $V_{si-res}$. LC filter 550 smooths power signal $V_{si-res}$ to produce power signal $V_{s-res}$. The magnitude of power signal $V_{s-res}$ during a particular time period will depend on the density of pulses 576 in power signal $V_{s-res}$. Power signal $V_{s-res}$ is diode-OR'd with power signal $V_l$ and $V_{LV}$ by diodes 251 and 404 to form power signal $V_p$, which is provided to power amplifier 204 at terminal 236.

Referring briefly to FIG. 2, PWM control signal 242 may have a duty cycle ranging from 0% to 100%. As a result, power signal $V_s$ may range from 0 volts to the magnitude $V_{max}$ of power source 212 (ignoring the negligible voltage drops across the components of main power supply 218).

Since PDM control signal 542 has a minimum off-time between each pulse 576 (FIG. 9), switch 546 cannot have a duty cycle of 100%. As a result, power signal $V_{s-res}$ has a lower magnitude than the magnitude $V_{max-res}$ of power supply 512 (which is analogous to power source 212). To allow power signal $V_{s-res}$ to have the same magnitude as power signal $V_s$ of the power amplifiers described above, the magnitude $V_{max-res}$ of power supply 512 must be higher than the magnitude $V_{max}$ of power source 212 (FIG. 2).

Since each pulse 576 produced by switch 546 will be identical, each pulse 576 will transfer a fixed amount of energy first into capacitor 574 and then into filter 550. The magnitude of power signal $V_{s-res}$ will depend entirely on the density of pulses 576 (i.e. on the variable off-time between pulses). When a low power signal $V_{s-res}$ is required, the density of pulses 576 may be quite low and the frequency of the pulses may actually be in the audio band. Also, if the density of pulses is low, a large ripple may be seen in power signal $V_{si-res}$ and if filter 550 has a desirable low time constant (which allows power signal $V_{s-res}$ to more closely follow the output signal 232, as described above in relation to power signal $V_s$ of power amplifier 400), power signal $V_{s-res}$ may also have a corresponding large ripple.

In order to reduce the effects of this large ripple (which are described above in relation to power amplifier 400), low voltage power supply 402 is included in power amplifier 500, in the same manner as in power amplifier 400. The use of low voltage power rail 402 is not necessary, particularly where the magnitude of output signal 232 will be relatively high, and the disadvantages of high ripple (which are more disadvantageous at a low output level) will not be substantial. If low voltage power rail 402 is included in power amplifier 500, PDM control circuit 516 may be configured to disengage main power supply 518 when the magnitude of output signal 232 is expected to be less than threshold $V_d$ (FIG. 7).

In this way, power signal $V_s$ may be formed using PDM control circuit 542 and main power supply 518 while generating substantially less EMI than is generated by PWM control circuit 242 and main power supply 218.

Figure 10:
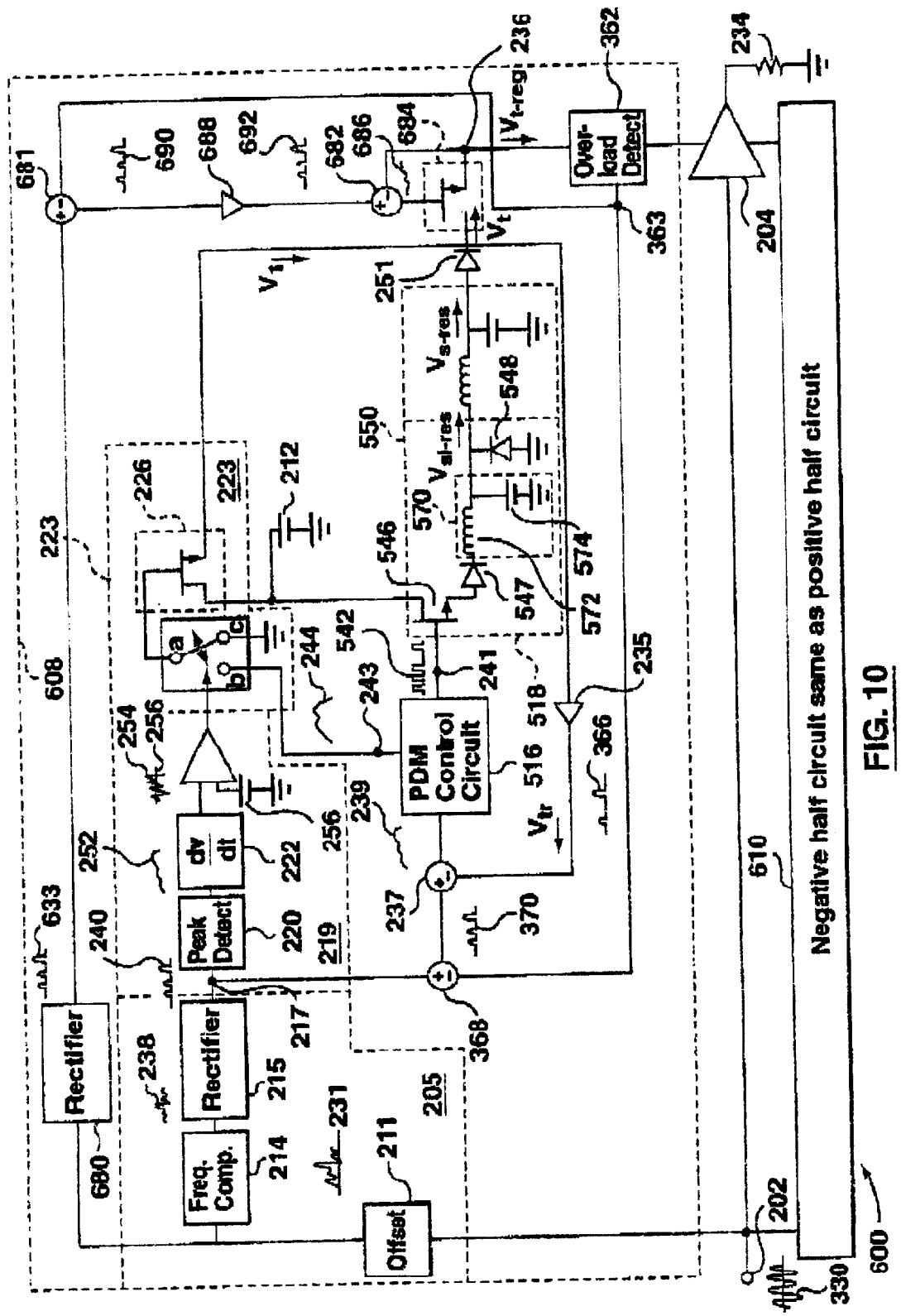
FIG. 10 illustrates a seventh embodiment of a power amplifier according to the present invention.

Reference is next made to FIG. 10, which illustrates a seventh embodiment of a power amplifier 600 according to the present invention. Power amplifier 600 has an input terminal 202, an amplifier 204 and an output terminal 206 which are connected and operate in the same manner is in power amplifier 200. Power amplifier 600 has positive half circuit 608 and a negative half circuit 610, which is similar in structure and complementary in operation to positive half circuit 608. Positive half circuit 608 is similar to positive circuit 508 of power amplifier 500, with three exceptions. First, positive half circuit 608 does not include low voltage power supply 402, which was included in positive half circuit 508 and described above in relation to power amplifier 400. Second, positive half circuit 608 includes an overload detect block 362, the coupling and operation of which described above in relation to power amplifier 300. Third, positive half circuit 608 includes a rectifier 680, a summer 681, an amplifier 688, a summer 682 and a post regulator 684.

Rectifier 680 is coupled to offset block 211 to receive offset input signal 231 and to provide a rectified input signal 633, which corresponds to the power level required by amplifier 204 to produce output signal 232 in response to input signal 230. Rectified input signal 633 differs from rectified signal 240 in that no frequency compensation block (such as frequency compensation block 214) is used to produce rectified input signal 633. As a result, rectified input signal 633 does not have the phase lead effect of rectified signal 240 and the magnitude of rectified input signal 633 corresponds to the power required at a particular time, rather than a slightly later time.

Summer 681 is coupled to rectifier 680 to receive rectified input signal 633 and to overload detect block 362 (at a terminal 363) to receive overload detect signal 366. Summer 681 provides a regulation signal 690 equal to the difference between rectified input signal 633 and overload detect signal 366. Regulation signal 690 corresponds to rectified input signal 633 reduced by any excess power which could damage amplifier 204.

Amplifier 688 receives regulation signal 690 and provides an amplified regulation signal 692, which corresponds to regulation signal 690 but has a magnitude range which corresponds to the magnitude range of power signal $V_r$.

Post regulator 684 may be a MOSFET type transistor, as shown in FIG. 9. The drain of post regulator 684 is coupled to the cathode of diode 251 to receive power signal $V_r$. The source of post regulator 684 is coupled to positive power input terminal 236 to provide a regulated power signal $V_{t\text{-}reg}$ to amplifier 204. The gate of post regulator 684 is coupled to summer 682. Summer 682 is coupled to amplifier 688 to receive amplified regulation signal 692 and to positive power input terminal 236 to receive power signal $V_{t\text{-}reg}$. Summer 682 provides a regulator error signal 686 which is equal to the difference between amplified rectified input signal 683 and power signal $V_{t\text{-}reg}$. Regulator error signal 686 reflects the difference between the power required by amplifier 204 to produce output signal 232 and the power actually being provided to amplifier 204 at positive power input terminal 236. If regulator error signal 686 is positive, then amplifier 204 is receiving more power than is required (or more power than is safe, based on overload detect signal 366). Post regulator 684 reduces power signal $V_t$ received at the a drain of post regulator 684 and provides a smaller power signal $V_{t\text{-}reg}$ to amplifier 204.

Normally, amplified regulation signal 692 will be configured to maintain post regulator 684 in a saturated condition so that power signal $V_{t\text{-}reg}$ is essentially equal to power signal $V_t$. The offset added by offset block 211 to input signal 230 to produce offset input signal 231 may be sufficient to produce this result. However, the amplification factor of amplifier 688 may also be used to ensure that post regulator 684 is normally saturated. However, when an overload condition is detected by overload detector 362, regulation signal 690 and amplified regulation signal 692 will fall quickly and post regulator 684 will act to limit power signal $V_{t\text{-}reg}$. Post regulator 684 operates as a linear regulator, and preferably, it is highly responsive to changes in its gate voltage. Post regulator may be a power transistor, such as a power MOSFET, IGBT, BJT, or any other device which may be used a regulator.

In this way post regulator 684 is able to quickly reduce the power signal $V_{t\text{-}reg}$ provided to amplifier 204 at positive power input terminal 236. Post regulator 684 is particularly useful when amplifier 204 is implemented as a power integrated circuit which might be damaged by an overload in microseconds.

As noted above, positive half circuit 608 does not include low voltage power supply 402. In addition to regulating the level of power supply $V_{t\text{-}reg}$ when an overload occurs, post regulator 684 also smooths power signal $V_t$ so that power signal $V_{t\text{-}reg}$ has less ripple than power signal $V_r$. As noted above in relation to power amplifier 400, one reason for using low voltage power supply 402 to eliminate the use of main power supply 218 (or resonant switching regulator 518) was to reduce the problem of a relatively large ripple on power signal $V_t$ when power signal $V_t$ had a relatively low magnitude. Since this ripple will be reduced by post regulator 684, the need for low voltage power supply 402 is reduced. If desired, low voltage power supply 402 may be incorporated into power amplifier 600 and a person skilled in the art will be capable of doing so.

Power amplifiers 200, 280, 300, 400, 500 and 600 utilize a feedback control system to ensure that power signal $V_t$ (or $V_{t\text{-}reg}$ in power amplifier 600) provides sufficient power to amplifier 204 to allow it to produce output signal 232 without excessive headroom. This feedback circuit will now be described, in the context of power amplifier 600, with reference to FIGS. 11 and 12.

FIG. 11 illustrates terminal 217 (FIG. 10), at which rectifier 215 produces rectified signal 240, summers 237 and 368, peak detector 220, differentiator 222, switch 224, part of PDM control circuit 516, a bias point network 702 and a rectified signal amplification network 704.

Bias point network 702 comprises resistor $R_1$, $R_2$, $R_3$ and a zener diode $D_1$. Resistor $R_1$ is coupled between ground and a terminal 706. Resistor $R_2$ is coupled between terminal 706 and a terminal 708. Resistor $R_3$ is coupled between terminal 708 and the most negative point of power amplifier 600 (FIG. 9). The most negative point of power amplifier 600 will, in general, be substantially more negative than the ground of power amplifier 600 and a person skilled in the art will be capable of selecting such a point. Zener diode $D_1$ is coupled between terminal 708 and ground. Resistors $R_1$ and $R_2$ form a voltage divider across zener diode $D_1$ so that terminal 706 will have a voltage less than ground (i.e. if zener diode $D_1$ has a zener voltage of 5 volts, $R_1=10$ k$\Omega$ and $R_2=25$ k$\Omega$, then terminal 706 will have a voltage of $-1.43$ volts). The voltage at terminal 706 provides a bias voltage for transistors $Q_2$ and $Q_3$, which are described below. In general, the bias voltage will be set to be less than $-0.7$ volts.

Summers 237 and 368 are combined and implemented as a single summing network 708. Summing network 708 comprises transistors $Q_1$, $Q_2$, $Q_3$ and $Q_4$, resistors $R_4$, $R_5$, $R_6$ and $R_7$, a diode $D_2$ and a capacitor $C_1$. The emitter of pnp transistor $Q_1$ is coupled to terminal 236 through resistor $R_4$ to receive power signal $V_{t\text{-}reg}$. Power signal $V_{t\text{-}reg}$ is converted into a current signal $i_t$ by resistor $R_4$. The base of transistor $Q_1$ is coupled to ground, and accordingly, a current signal $i_o$ is provided at the collector of transistor $Q_1$. Since the base of transistor $Q_1$ is coupled to ground, current signal $i_o$ will generally be equal current signal $i_t$ (so long as power signal $V_{t\text{-}reg}$ exceed ground by 0.7 volts). Current signal $i_o$ represents the magnitude of output signal $V_{t\text{-}reg}$ at any particular time.

The collector of transistor $Q_1$ is coupled to the collector of diode-connected transistor $Q_3$. The collector of transistor $Q_3$ is also coupled to terminal 363 through diode $D_2$ to receive overload detect signal 366, which is a current signal and is shown as current signal $i_d$. The emitter of transistor $Q_3$ is coupled ground through a resistor $R_6$. Terminal 363 is coupled to ground through capacitor $C_1$ which operates to integrate and smooth overload detect signal 366. Diode $D_2$ ensures that no current flows into terminal 363 from summing network 708. Current signal $i_o$ and overload detect signal $i_d$ are summed at the collector of transistor $Q_3$ to form a current signal $i_{sum}$, which flows from the collector to the emitter of transistor $Q_3$.

Transistor $Q_4$ is coupled to transistor $Q_3$ as a current mirror. The base of transistor $Q_4$ is coupled to the base and collector of transistor $Q_3$. The emitter of transistor $Q_4$ is coupled to ground through resistor $R_7$. A current equal to $i_{sum}$ flows from the collector to the emitter of transistor $Q_4$. This current $i_{sum}$ is drawn from a terminal 710.

The emitter of pnp transistor $Q_2$ is coupled to terminal 217 through resistor $R_5$ to receive rectified signal 240, which corresponds to the amount of power required by amplifier 204 to produce output signal 232 (FIG. 10). The base of transistor $Q_2$ is coupled to terminal 706 and the emitter of transistor $Q_2$ is coupled to terminal 710. Resistor $R_5$ converts rectified signal 240 into a current signal $i_r$, which flows from the emitter to the collector of transistor $Q_2$, as long as rectified signal 240 exceeds the bias voltage at terminal 706 by 0.7 volts. Since rectified signal 240 is always above 0 volts, and since the bias voltage will generally be selected to less than −0.7 volts, current $i_r$ will flow when ever rectified signal 240 is non-zero.

A current signal $i_e$, flows out from terminal 710 to terminal 712. Current signal $i_e$ will be equal to current $i_r$ less current $i_{sum}$. Current signal $i_e$ is error signal 239 (FIGS. 1 and 9) and corresponds to the difference between the power that amplifier 204 requires and the power that it is presently receiving.

One part of PDM control signal 516 includes transistor $Q_7$. The base of transistor $Q_7$ is coupled to terminal 712. The collector of transistor $Q_7$ is coupled to a voltage source $V_{cc}$ and the emitter of transistor $Q_7$ is coupled to terminal 243. Transistor $Q_7$ is coupled as an emitter-follower and simply buffers error signal 239 (or $i_e$) and provides control signal 244 (equal to error signal 239) at terminal 243.

Rectified signal amplification circuit 704 includes transistors $Q_5$ and $Q_6$ and resistors $R_8$ and $R_g$. The emitter of pnp transistor $Q_5$ is coupled to terminal 217 through resistor $R_8$. The base of transistor $Q_5$ is coupled to terminal 706. The collector of transistor $Q_5$ is coupled to terminal 714. Resistor $R_9$ is coupled between terminal 714 and ground. Resistor $R_9$ is selected double the resistance of resistor $R_8$. The base of transistor $Q_6$ is coupled to terminal 714. The collector of transistor $Q_6$ is coupled to a voltage source $V_{cc}$ and the emitter of transistor $Q_6$ is coupled to a terminal 716. Resistor $R_8$ and transistor $Q_5$ operate in the same manner as (and may actually be matched to) resistor $R_5$ and transistor $Q_2$ to provide a current signal $i_p$ (which may be equal to current signal $i_r$) at the collector of transistor $Q_5$. Current signal $i_p$ corresponds to the magnitude of rectified signal 240. Current signal $i_p$ flows through resistor $R_9$ to ground, with the result that the voltage at terminal 714 is equal to 2 times the voltage of rectified signal 240 at any particular time. Transistor $Q_7$ is configured as an emitter-follower and simply buffers the voltage at terminal 714 to a voltage signal $V_{rect}$ (equal to 2 times rectified signal 240) at terminal 716.

Peak detector 220 consists of a capacitor $C_9$ and a resistor $R_{10}$ coupled in series between terminal 716 and ground. Peak detector 220 operates in known manner to provide peak signal 252 at terminal 718.

Differentiator 222 consists of a capacitor $C_3$ and resistor $R_{11}$ and $R_{12}$. Capacitor $C_3$ and resistor $R_{11}$ are coupled in series between terminal 718 and ground. Resistor $R_{12}$ is coupled between the junction of capacitor $C_3$ and resistor $R_{11}$ and a terminal 720. Differentiator 222 operates in known manner to provide differential signal 254 at terminal 720.

Switch 224 comprises transistors $Q_8$ and $Q_9$ and resistors $R_{13}$, $R_{14}$ and $R_{15}$. The base-emitter junction of transistor $Q_8$ is coupled between terminal 720 and ground. The collector of transistor $Q_8$ is coupled to the base of transistor $Q_9$ through resistor $R_{14}$. Resistor $R_{14}$ and the base of transistor $Q_9$ are coupled to voltage source $V_{cc}$ through resistor $R_{13}$. The emitter of pnp transistor $Q_9$ forms terminal b of switch 224 and is coupled to terminal 243 to receive control signal 244. The collector of transistor $Q_9$ forms terminal a of switch 224. Terminal a is coupled to the gate of linear regulator 226 (FIGS. 3 and 10). The collector of transistor $Q_9$ is coupled to ground through resistor $R_{15}$. The ground side connection of resistor $R_{15}$ forms terminal c of switch 224.

Switch 224 operates as follows. When differentiated signal 254 exceeds 0.7 volts, the base-emitter junction of transistor $Q_8$ is forward biased, and transistor $Q_8$ turns on. Resistor $R_{13}$ and $R_{14}$ form a voltage divider between voltage source $V_{cc}$ and ground, thereby setting a base voltage for pnp transistor $Q_9$. When control signal 244 (at the collector of transistor $Q_9$) exceeds this base voltage, transistor $Q_9$ conducts and couples terminal 243 (and terminal b) to terminal a, thereby allowing control signal 244 to control linear regulator 226. If differentiated signal 254 does not exceeds 0.7 volts, then transistor $Q_8$ does not conduct and the base of transistor $Q_9$ is pulled up to $V_{cc}$ through resistor $R_{13}$. Voltage source $V_{cc}$ is selected so that control signal 244 will not exceed it and therefore, transistor $Q_9$ will not conduct. Terminal a will be pulled down to ground through resistor $R_{15}$, and will be effectively coupled to terminal c. Threshold 256 is considered to be exceeded if both (i) differentiated signal 254 exceeds 0.7 volts and (ii) control signal 244 exceeds the base voltage of $Q_9$ when condition (i) is met.

In this way, rectified signal 240, power signal $V_{t\text{-}reg}$ and overload detect signal 366 are used to generate error signal 239 and control signal 244. Switch 224 operates in response to differential signal 254 to selectively couple control signal 244 to the gate of linear regulator 226 (FIGS. 3 and 10).

Figure 12:
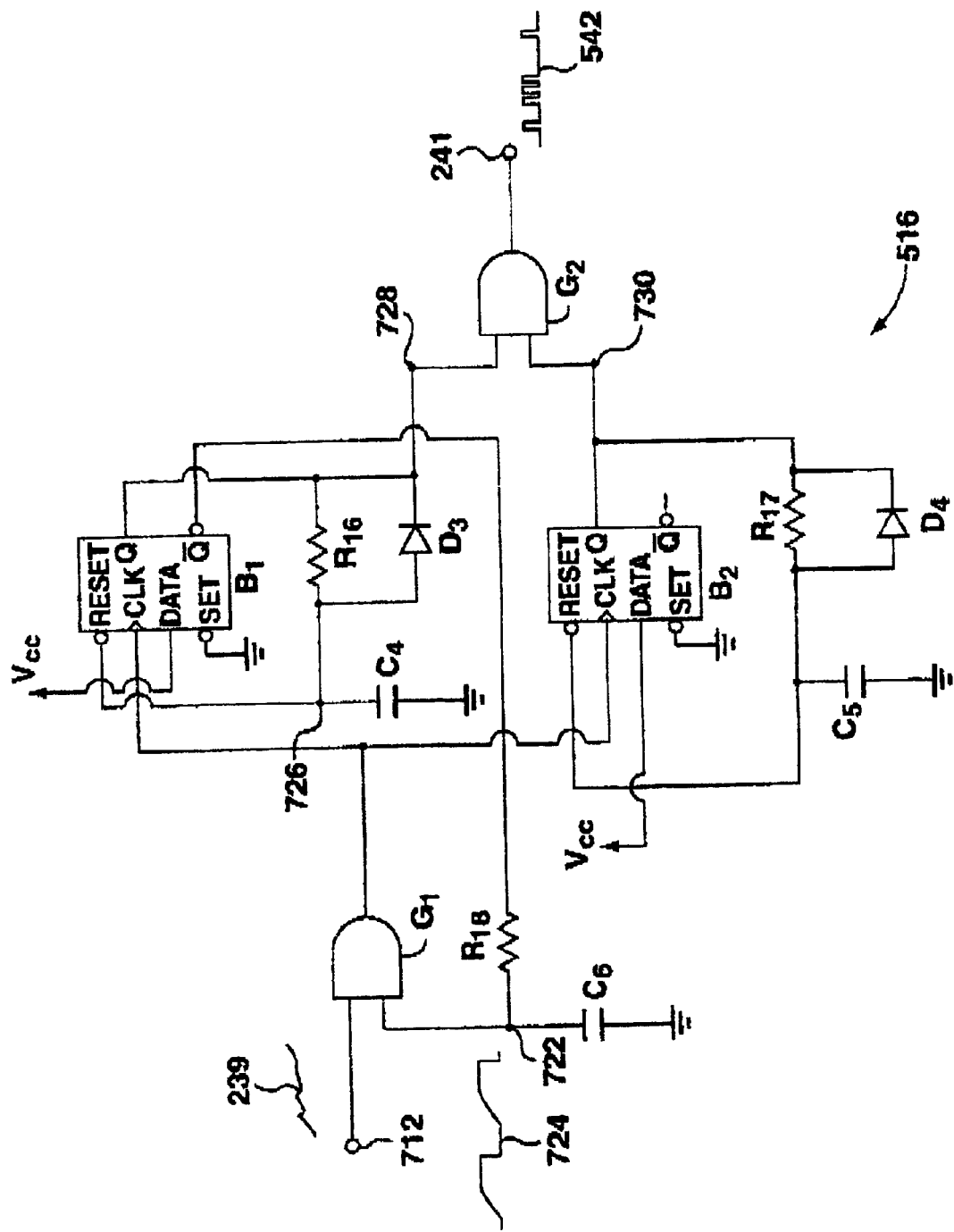
FIG. 12 illustrates another part of the feedback control circuit of the power amplifier of FIG. 10.

FIG. 12 illustrates another portion of PDM control circuit 516 which uses error signal 239 to generate PDM control signal 542. PDM control circuit 516 comprises AND gates $G_1$ and $G_2$, buffers $B_1$ and $B_2$, resistors $R_{16}$, $R_{17}$ and $R_{18}$, capacitors $C_4$, $C_5$ and $C_6$ and diodes $D_3$ and $D_4$.

One input terminal of AND gate $G_1$ is coupled to terminal 712 to receive error signal 239. The other input terminal of AND gate $G_1$ is coupled to node 722, to receive a delay signal 724, the operation of which is explained below. When both error signal 239 and delay signal 724 exceed the high input threshold 721 of AND gate $G_1$, AND gate $G_1$ provides a high signal to the clock inputs CLK of buffers $B_1$ and $B_2$.

Buffer $B_1$ has a DATA input which is coupled to voltage source $V_{cc}$ (which is a high signal). When AND gate $G_1$ provides a high signal to the clock input CLK of buffer $B_1$, buffer $B_1$ provides a high signal at its Q output and at a node 728. At the same time, buffer $B_1$ will provide a low signal at its Q-not output. The Q output of buffer $B_1$ is coupled to ground through resistor $R_{16}$ and capacitor $C_4$. The junction of resistor $R_{16}$ and capacitor $C_4$ forms a terminal 726, which is coupled to a RESET terminal of buffer $B_1$. Diode $D_3$ is coupled in parallel with resistor $R_{16}$ between nodes 726 and 728. Resistor $R_{16}$ and capacitor $C_4$ act a delay circuit. Assuming that capacitor $C_4$ is initially discharged (i.e. the signal at terminal 726 is low), the high output signal at the Q output of buffer $B_1$ will charge capacitor $C_4$. The rate at which capacitor $C_4$ is charged will depend on the time constant of resistor $R_{16}$ and capacitor $C_4$. Eventually the voltage at terminal 726 (and at the RESET input of buffer $B_1$) will become high, and buffer $B_1$ will reset is Q output and terminal 728 to a low signal and its Q-not output to a high signal. Capacitor $C_4$ will be discharged through diode $D_3$ and return to its initial discharged condition. Referring also to FIG. 12, buffer $B_1$ thereby produces a pulse 732 which remains high for a time period $t_9$ at node 728.

In an identical fashion, buffer $B_2$ produces a pulse 734 which remains high for a time $t_{10}$ at terminal 730. Time $t_{10}$ of pulse 734 will depend on the time constant of resistor $R_{17}$ and capacitor $C_5$. Diode $D_4$ provides a discharge path for capacitor $C_5$ when the Q output of buffer $B_2$ is low. In PDM control circuit 516, the values of resistors $R_{16}$ and $R_{17}$ and capacitors $C_4$ and $C_5$ are selected so that the time constant of resistor $R_{17}$ and capacitor $C_5$ is shorter than the time constant of resistor $R_{16}$ and capacitor $C_4$. As a result, pulse 734 is shorter than pulse 732 (i.e. time $t_{10}$ is shorter than time $t_9$).

The Q-not output of buffer $B_1$ is coupled to ground through resistor $R_{18}$ and capacitor $C_6$. The junction of resistor $R_{18}$ and capacitor $C_6$ forms node 722, which is coupled to the second input of AND gate $G_1$. When the Q-not output of buffer $B_1$ becomes high (at the end of pulse 732), resistor $R_{18}$ and capacitor $C_6$ acts a delay circuit. After a time $t_{11}$, capacitor $C_6$ will be sufficiently charged so that node 722 is a high signal. After this time, AND gate will again provide a high signal to the clock inputs CLK of buffers $B_1$ and $B_2$ when error signal 239 is a high signal. This may occur immediately or may occur after some delay.

The inputs of AND gate $G_2$ are coupled to terminals 728 and 730 to receive pulses 732 and 734. The output of AND gate $G_2$ is coupled to terminal 241 to provide PDM control signal 542. As described earlier, PDM control signal 542 regulates the power signal $V_{s-res}$ produced by main power supply 518. PDM control consists of a series of pulses which have a constant on-time (during which switch 546 (FIG. 10) is closed, a minimum off-time following each pulse during which switch 546 must remain open and a variable off-time between pulses which must exceed the minimum off-time and during which switch 546 remains open.

Figure 13:
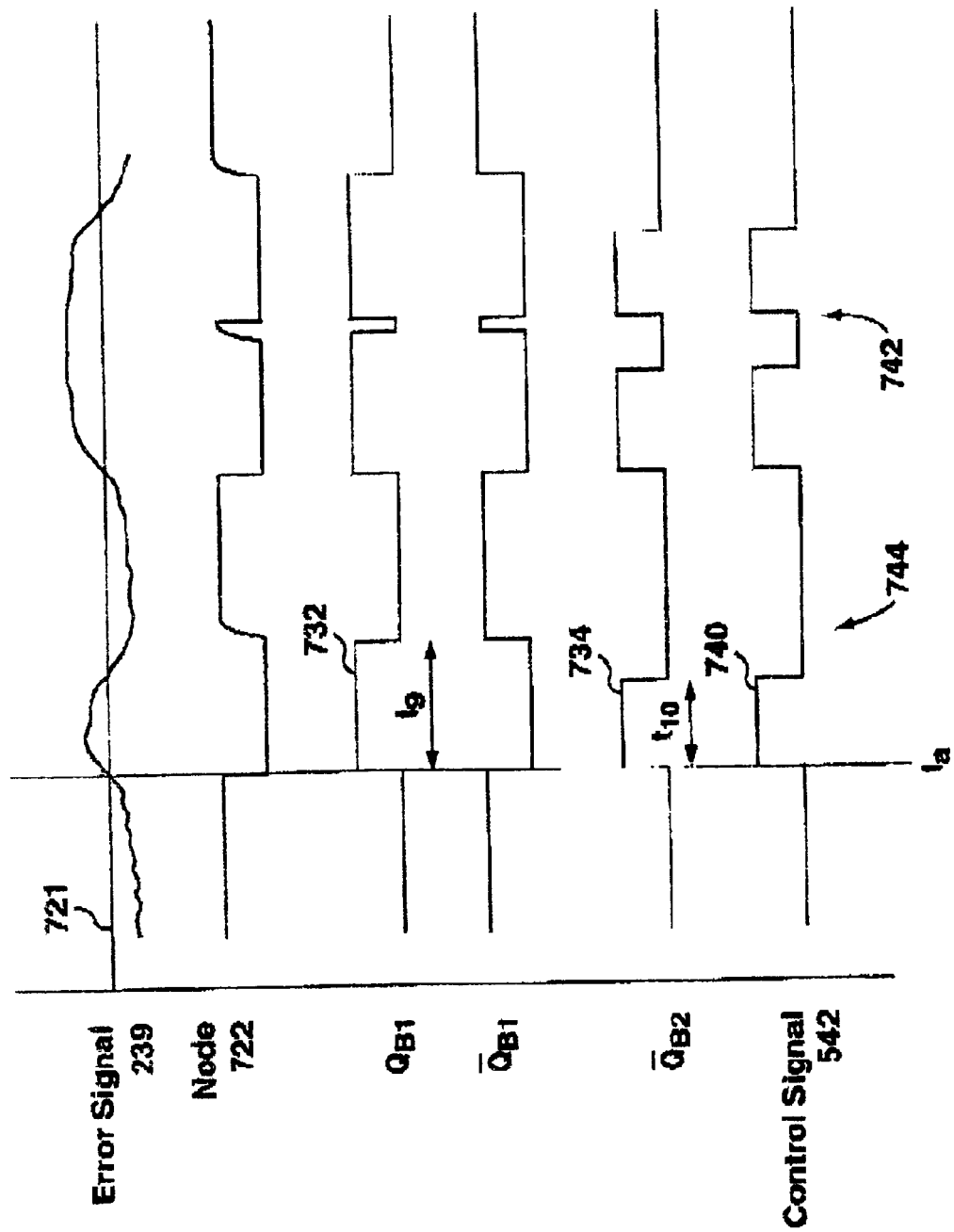
FIG. 13 is a timing diagram illustrating the production of PDM control signal of the power amplifier of FIG. 10.

Reference is made to FIG. 13. The constant on-time, minimum on-time and variable on-time of PDM control signal 542 are configured as follows. Prior to time $t_a$, the outputs of both buffers $B_1$ and $B_2$ are low (i.e. PDM control signal 542 is low). At this time, node 722 will have a high signal level.

At time $t_2$, error signal 239 exceeds the high input threshold 721 of AND gate $G_1$, which will then initiate the generation of pulses 732 and 734. At the same time, node 722 will fall to a low value. AND gate $G_2$ will begin a high pulse 740 on PDM control signal 542, since both of its inputs (at terminals 728 and 730) are high. High pulse 740 will end after time $t_{10}$, when pulse 734 ends. Since the time $t_{10}$ of pulse 734 is defined only by the time constant of resistor $R_{17}$ and capacitor $C_5$, this time constant fixes the constant on-time of each high pulse of PDM control signal 542 to be equal to time $t_{10}$.

Pulse 732 will continue until time $t_9$ has elapsed. During this period, node 722 has a low signal level, and therefore, the output of AND gate $G_1$ is low. As a result a new high pulse cannot begin on PDM control signal 542 until after time $t_9$. This defines the minimum off-time of PDM control signal 542 to be equal to $t_9-t_{10}$.

When pulse 732 ends after time $t_9$, the signal level of node 722 will rise and eventually will become a high signal again. After this time, a new high pulse will be initiated on PDM control signal 542 whenever error signal 239 exceeds the high input threshold 721 of AND gate $G_1$. This may occur immediately, as shown at 742 or after a delay, as shown at 744.

The circuits of FIG. 11 and 12 provide PDM control signal 542 and control signal 244, which control linear regulator 226 and main power supply 518 of power amplifier 600 (FIG. 9). The circuit of FIG. 10 may be modified to provide an error signal suitable for use in power amplifier 500 by removing the coupling between the collector of transistor $Q_3$ and terminal 363 (since power amplifier 500 does not include an overload detection block 362). The circuits of FIGS. 11 and 12 may be modified to provide a PWM control signal 242 to control the main power supply 218 of power amplifiers 200, 280, 300 or 400. A person skilled in the art will capable of making these amendments.

Figure 14:
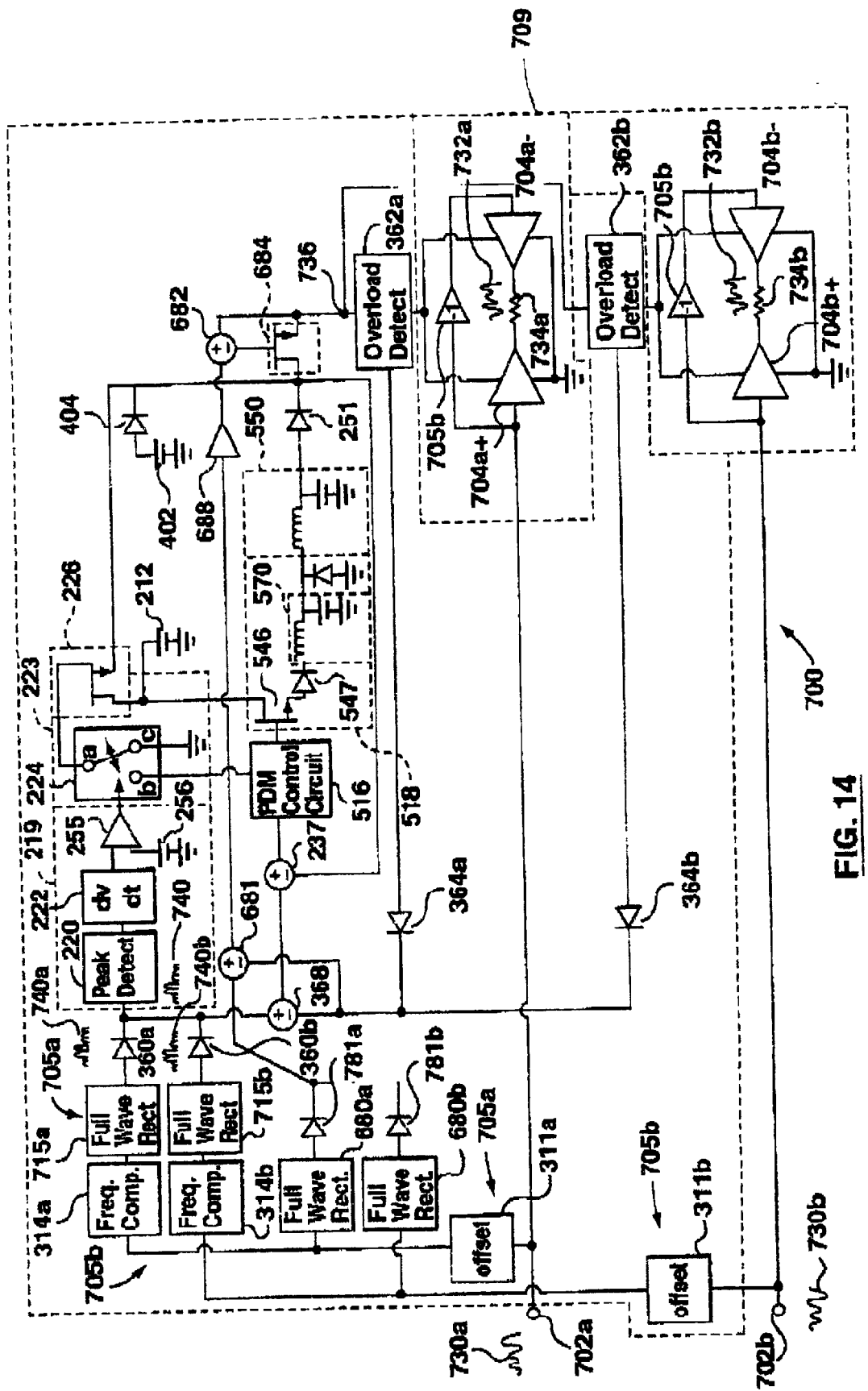
FIG. 14 illustrates an eighth embodiment of a power amplifier according to the present invention.

Reference is next made to FIG. 14, which illustrates an eighth embodiment of a power amplifier 700 according to the present invention. Power amplifier 700 is a bridge amplifier which can amplify two input signals 730a and 730b simultaneously. Like power amplifier 300 (FIG. 4), components of power amplifier 700 which relate only to input signal 730a are identified by a reference numeral containing the letter "a" and components of power amplifier 700 which relate only to input signal 730b are identified by a reference numeral containing the letter "b". Power amplifier 700 has two input terminals 702a and 702b, a power supply circuit 708 and two bridge amplifiers 709a and 709b.

Bridge amplifier 709a includes two amplifiers 704a+ and 704a− and an inverter 705a. The input terminal of amplifier 704a+ is coupled to input terminal 702a to receive an input signal 730. The input terminal of amplifier 704a− is coupled to input terminal 702a through inverter 705a. Amplifier 704a+ amplifies positive half waves of input signal 730a. Amplifier 704a− amplifies negative half waves of input signal 730a. Together, amplifier 704a+ and 704a− provide an output signal 732a corresponding to input signal 730a. Load 734a is coupled between the outputs of amplifiers 704a+ and 704a− to receive output signal 732, which is formed between the output terminals of amplifiers 704a+ and 704a−.

Similarly, bridge amplifier 709b includes two amplifiers 704b+ and 704b− and an inverter 705b, which are coupled to input terminal 702b to receive an input signal 730b. Amplifiers 704b+ and 704b− cooperate to produce an output signal 732b between their output terminals, to which load 734b is coupled.

The detailed structure and operation of bridge amplifiers 709a and 709b are set out in U.S. Pat. No. 5,075,634, entitled COMPOSITE BRIDGE AMPLIFIER, which is incorporated herein by this reference.

Power supply circuit 708 is similar in structure and operation to the positive half circuits 208, 308, 408, 508 and 608. The primary difference between power supply circuit 708 and these positive half circuits is that power supply circuit 708 provides power to bridge amplifiers 709a and 709b during positive and negative half waves of input signals 730a and 730b. Accordingly there is no "negative half circuit" in power amplifier 700.

Power supply circuit 708 has two input signal compensation blocks 705a and 705b, which respectively comprise offset blocks 311a and 311b, frequency compensation blocks 314a and 314b and rectifiers 715a and 715b. In order to make power supply circuit 708 operative during positive and negative half waves of input signals 730a and 730b, rectifiers 315a and 315b of power amplifier 300 have been replaced with rectifiers 715a and 715b, which are full wave rectifiers and produce full wave rectified signals 740a and 740b which are diode-OR'd by diodes 360a and 360b to produce a full wave rectified signal 740 at terminal 341.

Power supply circuit 708 also incorporates a number of other features of the power amplifiers described above: low voltage power supply 402, explained above in relation to power amplifier 400; overload detect blocks 362a and 362b, which respectively protect bridge amplifiers 709a and 709b and which were described above in relation to power amplifier 300; PDM control circuit 516 and main power supply 518, described above in relation to power amplifier 500; and post regulator 684, which was described above in relation to power amplifier 600.

Except as described above, power supply circuit 708 operates in a matter analogous to the positive half circuits described earlier and provides a power signal $V_{t\text{-}reg}$ at terminal 736 from which bridge amplifiers 709a and 709b receive power. Power signal $V_{t\text{-}reg}$ is sufficient to power both bridge amplifiers 709a and 709b.

Power amplifier 700 provides the advantages of reduced headroom and reduced EMI emissions which result from the use of resonant switching regulator 516 and low voltage power supply 402. Furthermore, power amplifier 700 does not require two half circuits to provide power to its amplifiers 204a +, 204a+, 204b+ and 204b−. Power amplifier 700 provides the advantage of a predictive control system for main power supply 518 and transient power supply 223 described above in relation to power amplifier 200.

Although power amplifiers 200, 280, 300, 400, 500, 600 and 700 may have reduced EMI emissions in comparison to prior art designs, a person skilled in the art will recognize that it is impossible to entirely eliminate EMI generation within such a device. Any EMI which is created within the power amplifier, and particularly within the positive and negative half circuits (or, in the case of bridge amplifier implementation, the power supply circuit) of the power amplifier may be coupled to the input terminal 202 of the amplifier. In addition, this EMI may be coupled on input signal 230 when it is received by power amplifier 200. Accordingly, it is desirable to (i) reduce the coupling of any EMI generated within the power amplifier to the input terminal and (ii) to reduce the coupling of any such EMI onto input signal 230 within the power amplifier.

Figure 15:
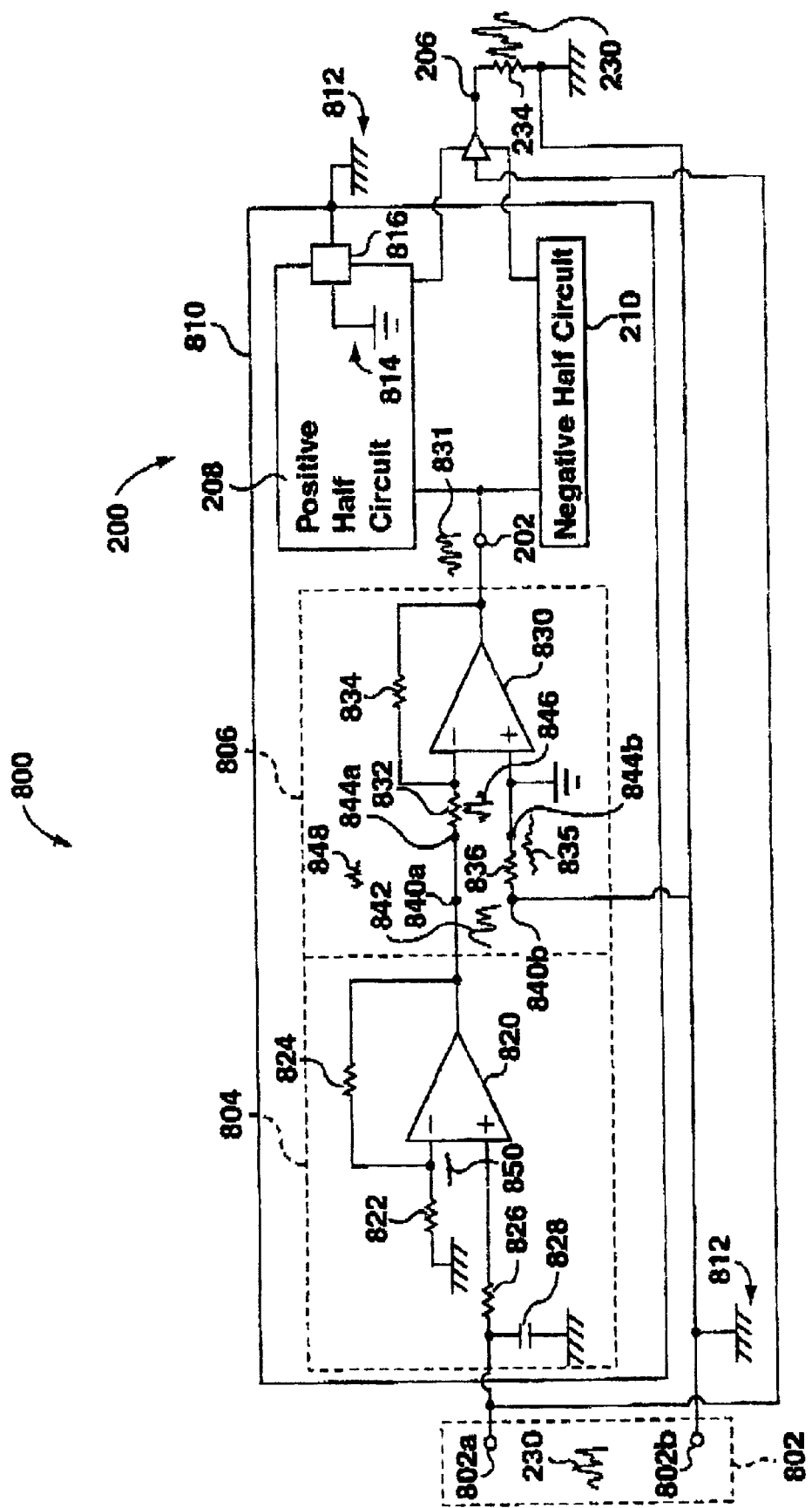
FIG. 15 illustrates an input filtration circuit according to the present invention which may be used with a power amplifier.

Reference is next made to FIG. 15, which illustrates an EMI isolation circuit 800 which may be used to decouple EMI generated within the positive and negative half circuits of power amplifier 200 from the input signal 230. EMI isolation circuit 800 is explained here in the context of power amplifier 200, EMI isolation circuit 800 may also be used with power amplifiers 280, 300, 400, 500, 600 and 700.

EMI isolation circuit 800 consists of a non-inverting amplification amplifier 804 and an inverting reduction amplifier 806 coupled in series between an input terminal 802 and terminal 202. (In other embodiments of EMI isolation circuit, amplifiers 804 and 806 may be non-inverting or inverting, depending on their desired operation.) Terminal 202 is the same terminal as input terminal 202 of the power amplifier discussed above, however, input signal 230 is now received at an input terminal 802, which consists of a signal input terminal 802a and a ground input terminal 802b, and is coupled to terminal 202 through EMI isolation circuit 800. Amplifier 804 is coupled to input terminal 802a to receive input signal 230.

Positive half circuit 208, negative half circuit 210 and EMI isolation circuit 800 will typically be encased in an EMI shield 810. EMI shield 810 may be the chassis of an enclosure in which power amplifier 200 is installed. Typically, EMI shield 810 will have a ground level which may be referred to as a chassis ground 812. Positive half circuit 208 and negative half circuit 210 will have a separate power amplifier ground 814, which is floating in relation to chassis ground 812. Ground input terminal 802b and load 234 are coupled to chassis ground 812.

Reference numeral 816 identifies a coupling network between chassis ground 812 and power amplifier ground 814. Coupling network 816 actually comprises all of the paths between the two separate grounds.

Amplifier circuit 804 comprises an op-amp 820, resistors 822, 824 and 826 and a capacitor 828. The negative input terminal of op-amp 820 is coupled to chassis ground 812 through resistor 822 and to the output of op-amp 820 through resistor 824. The positive input terminal of op-amp 820 is coupled to signal input terminal 802a through resistor 826. Signal input terminal 802a is coupled to chassis ground 812 through capacitor 828. Resistors 822 and 826 are selected to have a large and equal resistance. Resistor 824 is selected to have a resistance much larger than that of resistor 822, thereby forming amplifier 804 into a non-inverting amplifying amplifier. Typically, resistors 822 and 826 may have a resistance greater than 50 kΩ such as 100 kΩ or more and resistor 824 may have a resistance of 1 MΩ. With these values, amplifier 804 will operate as a multiply-by-10 amplifier. Preferably, amplifier 804 is configured to have an amplification of 2 to 20 times, and more preferably it will have a gain of 3 to 15 times.

Amplifier circuit 806 comprises an op-amp 830 and resistors 832, 834 and 836. The negative input of op-amp 830 is coupled to the output of op-amp 820 through resistor 832 and to the output of op-amp 830 through resistor 834. The positive input terminal of op-amp 830 is coupled directly to power amplifier ground 814 and to chassis ground through resistor 836. Resistor 836 forms part of coupling network 816. Typically, resistor 836 will have a small resistance such as 1 kΩ. Resistor 832 is selected to have a much larger resistance than resistor 834, forming amplifier circuit 806 into an inverting reducting amplifier. Typically, resistor 832 may have a resistance of 10 kΩ and resistor 834 may have a resistance of 1 kΩ. With these values, amplification circuit 806 will act as a divide-by-10 reducing amplifier.

EMI isolation circuit 800 reduces the coupling of EMI generated within positive half circuit 208 and negative half circuit 210 onto input signal 230 within power amplifier 230 as follows. Within the context of EMI isolation circuit 800, any such EMI may be seen as an EMI signal 835 across resistor 836, which is the only coupling between the floating power amplifier ground 814 and the chassis ground 812. Input signal 230 is received across terminal 802a and 802b. Input signal 230 is amplified by amplifier 804, which provides an amplified input signal 842 across nodes 840a and 840b corresponding to input signal 230. Input signal 230 combined with EMI signal 835 form an EMI contaminated input signal 846 across terminal 844a and 844b. EMI contaminated input signal 846 is reduced by amplifier 806, providing an EMI-decoupled input 831 at terminal 202. This EMI-decoupled input signal 831 is then amplified by power amplifier 200, as described above to produce output signal 232.

EMI-decoupled input signal 831 will correspond substantially to input signal 230 with a relatively small degree of contamination from EMI signal 835. This effect may be seen through the following example. If input signal 230 has a magnitude of 3 volts, EMI signal has a magnitude of −1, amplifier 804 has an amplification of 10 and amplifier 806 has an amplification of 0.1, then amplified input signal 842 will have a magnitude of 30, EMI contaminated input signal 846 will have a magnitude of 29 and EMI-decoupled input signal 831 will have a magnitude 2.9. By amplifying input signal 230 by a selected factor before it is contaminated by EMI signal 835 and then reducing EMI contaminated input signal 846 by the same factor, the effect of EMI signal 835 on input signal 230 is reduced by the selected factor, and consequently, the effect of EMI signal 835 on the operation of power amplifier 200 is reduced. It is not necessary that the amplification factor of amplifier 806 be the reciprocal of the amplification factor of amplifier 806. The amplification factors of amplifiers 804 and 806 may be varied to provide a desired degree of reduction of EMI signal 835 and an appropriate input signal for power amplifier 200.

EMI isolation circuit 800 also operates to decouple EMI signal 835 from input terminal 802, and thereby reduces the effect of EMI signal 835 on output signal 232. An EMI signal 850 corresponding to EMI signal 835 will be injected into terminals 849a and 849b at the positive and negative inputs of op-amp 820. Resistors 822 and 826 have a high resistance, as described above, and provide a high impedance to EMI signal 850, thereby substantially decoupling EMI image signal 850 from input terminal 802. Amplifier 804, which receives input signal 230 from input terminal 802 thus receives an input signal which is not substantially contaminated by EMI.

By using EMI isolation circuit 800 as an input circuit coupled to the input terminal 202 of a power amplifier according to the present invention, EMI generated within the power amplifier may be substantially decoupled both from the input terminal 202 and the input signal 230.

Figure 16:
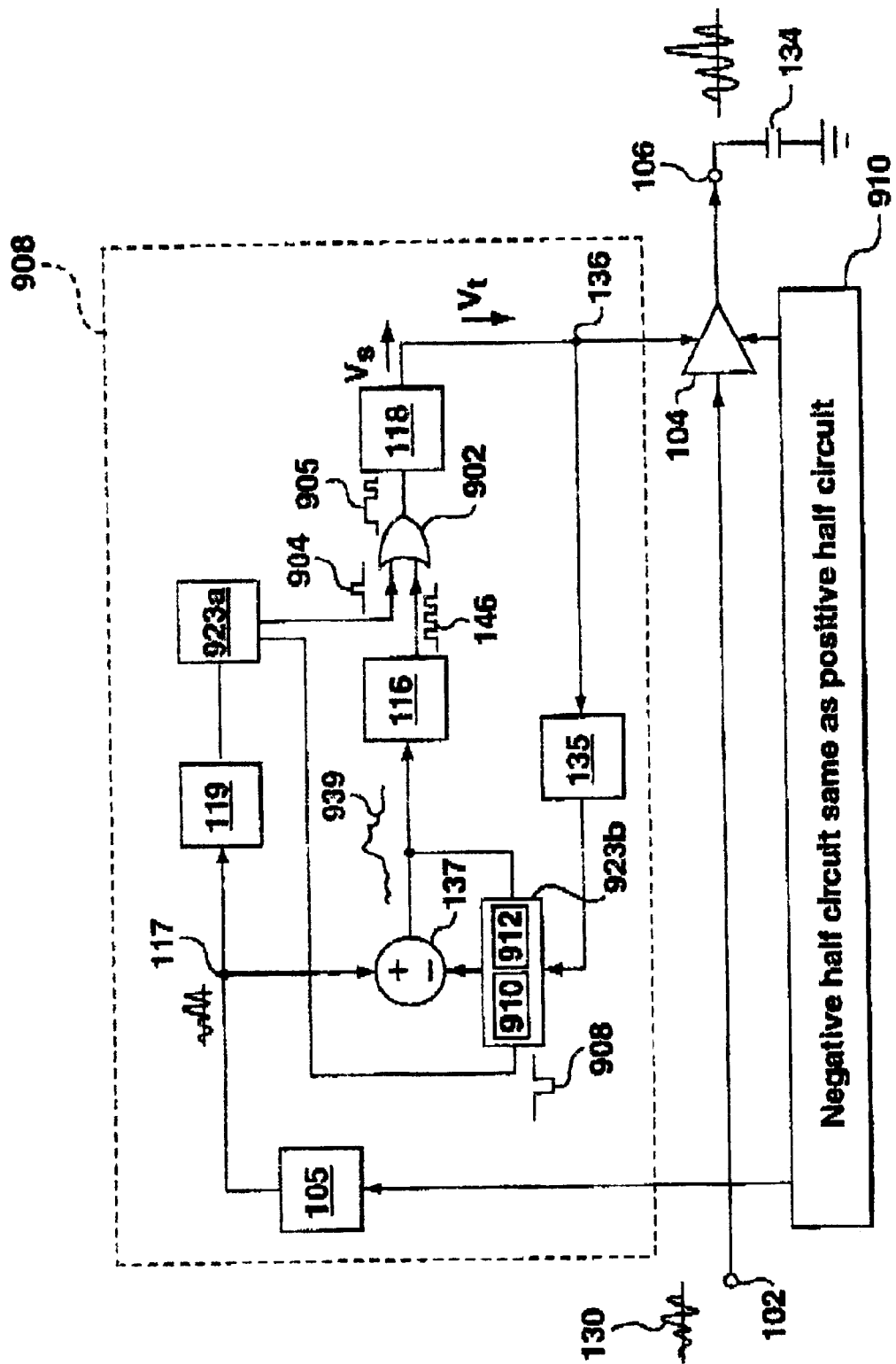
FIG. 16 is a block diagram of a ninth embodiment of a power amplifier according to the present invention.

Reference is next made to FIG. 16, which is a block diagram of a ninth power amplifier 900 according to the present invention. Power amplifier 900 has an input terminal 102, an amplifier 104, and output terminal 106, a positive half circuit 908 and a negative half circuit 910, which has the same structure and a complementary operation to that of positive half circuit 908. In power amplifier 900, input compensation block 105, transient detect block 119, control circuit 116, main power supply 118 and amplifier 104 operate as in power amplifier 100. The transient operation of power amplifier 900 differs from that of power amplifier 100. Transient power supply 123 has been replaced by first and second transient control circuits 923a and 923b, which operate in conjunction with summer 937 and OR gate 902 to modify the power signal $V_s$ produced by main power supply 118.

Transient control circuit 923a has two digital output signals: a first transient control signal 904 and a second transient control signal 908. In this exemplary embodiment of power amplifier 900, transient control signal 904 is normally low and transient control signal 908 is normally high when power amplifier 900 is in its normal operation.

When transient detect block 119 detects a change in input signal 130 that requires power amplifier 900 to enter transient operation, transient control circuit 923a generates a high pulse in transient control signal 904, which is OR'd with control signal 942 to produce a main power supply control signal 906. Main power supply control signal 906 is high when either control signal 142 or first transient control signal 904 is high. Control signal 906 is a PWM signal similar to control signal 242 of power amplifier 200, and can have a duty cycle between 0 and 100%, depending on the value of compensated input signal 140. Main power supply 118 is responsive to main power supply control signal 906 and produces power signal $V_s$ with a magnitude corresponding to main power supply control signal 906. When transient control signal 904 is low, main power supply control signal 906 is identical to control signal 142, and main power supply 118 provides power signal $V_s$ as in power amplifier 100. When transient control signal 904 is high, main power supply control signal 906 will be high (i.e. it will have a duty cycle of 100%), and main power supply 118 will provide power signal $V_s$ at its highest voltage.

When transient detect block 119 detects a change in input signal 130 that requires power amplifier 900 to enter transient operation, transient control circuit 923b also generates a low pulse on transient control signal 908. Transient control circuit 923a receives the low pulse and alters transient control signal 904 to increase the magnitude of error signal 939 in response to it. Control circuit 116 receives the increased error signal 939 and increases the duty cycle of control signal 142 in response. After a selected time, transient control circuit 923a ends the high pulse on transient control signal 904 and main power supply 118 becomes responsive to control signal 142. Main power supply 118 will provide power signal $V_s$ with a voltage level corresponding to the increased duty cycle of control signal 142.

Transient control circuit 923b includes a fast attack block 910 and a slow release block 912. Fast attack block 910 operates to quickly increase the magnitude of error signal 939 in response to a low pulse on transient control signal 908. Slow release block 912 operates to slowly reduce the increase in error signal 939, until, after a selected time, transient control circuit 923b has no effect on error signal 939. Power amplifier 900 then returns to normal operation.

Power amplifier 900 does not have a transient power supply (such as transient power supply 123 or 223). Instead, first and second transient control circuits 923a and 923b modify the power signal $V_s$ provided by main power supply by increasing the duty cycle of main power supply control signal 906 when power amplifier 900 is in its transient operation.

Figure 17:
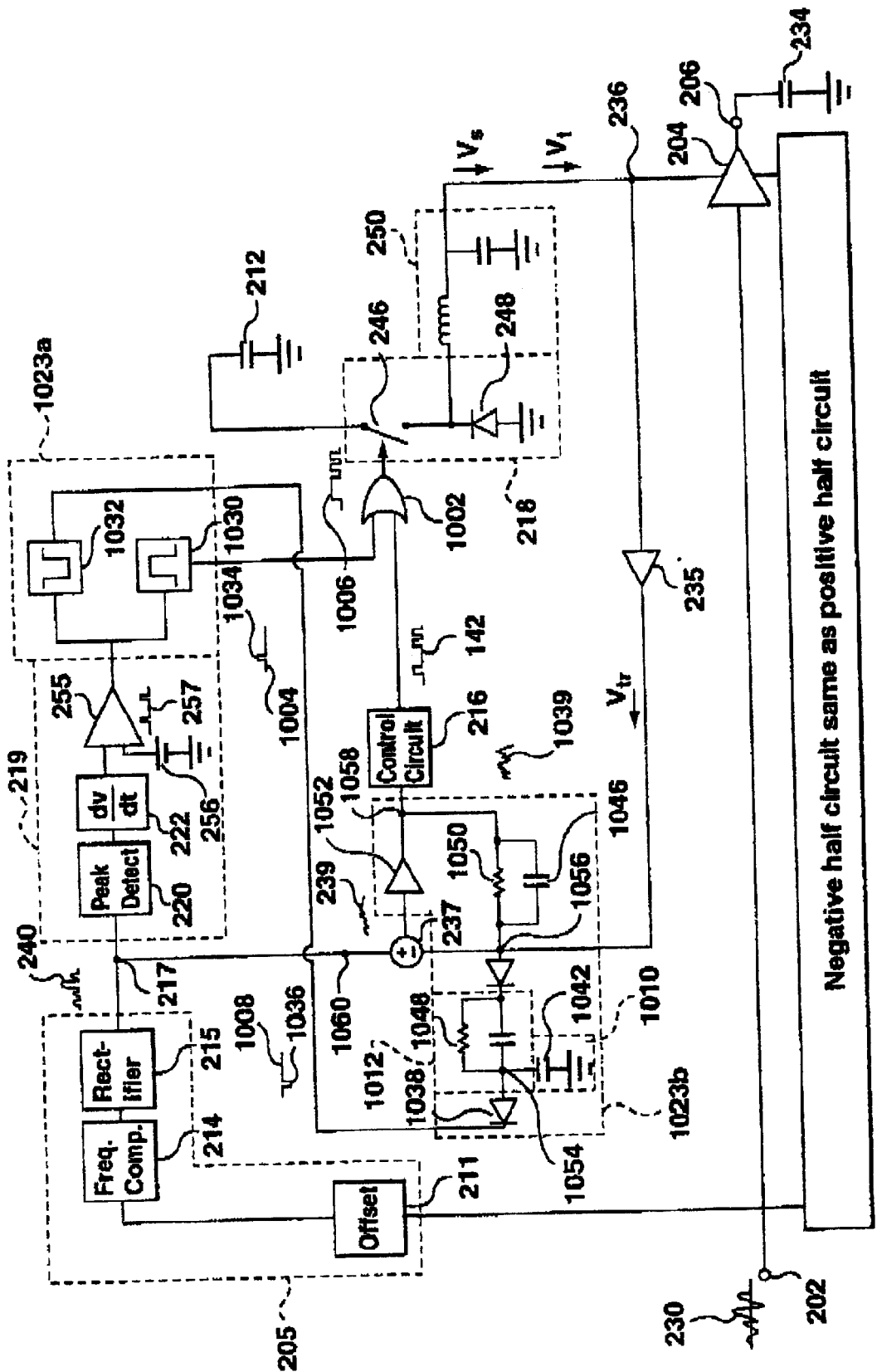
FIG. 17 illustrates a tenth embodiment of a power amplifier according to the present invention.

Reference is next made to FIG. 17, which illustrates a power amplifier 1000. Power amplifier 1000 is a more detailed embodiment of a power amplifier based on the general structure of power amplifier 900. Power amplifier 1000 has an input terminal 202, an amplifier 204, an output terminal 206, a positive half circuit 1008 and a negative half circuit 1010. Negative half circuit 1010 has the same structure and a complementary operation to that of positive half circuit 1008. Positive half circuit 1008 includes an input signal compensation block 205, a transient detect block 219, a control circuit 216 and a main power supply 218, which are coupled and operate in the same manner as the corresponding components in power supply 200 (FIG. 2). Positive half circuit also includes first and second transient control circuits 1023a and 1023b and an OR gate 1002, which correspond to first and second transient control circuits 923a and 923b and OR gate 902 of power amplifier 900 (FIG. 16).

First transient control circuit 1023 includes two one-shot circuits 1030 and 1032, both of which are responsive to transient signal 257. One-shot circuit 1030 provides transient control signal 1004, which corresponds to transient control signal 904 of power amplifier 900 (FIG. 16). When power amplifier 1000 in its normal operation, transient control signal 1004 is low. One-shot circuit 1032 provides transient control signal 1008, which corresponds to transient control signal 908 of power amplifier 900 (FIG. 16). When power amplifier 1000 is in its normal operation, transient control signal 1008 is high. First transient control signal 1004 is OR'd with control signal 142 to generate main power supply control signal 1006, which controls switch 246 of main power supply 218.

When transient signal 257 becomes high, power amplifier 1000 enters its transient operation. In response to transient signal 257 becoming high, one-shot circuit 1030 provides a high pulse 1034 on transient control signal 1004, causing main power supply control signal 1006 to become high. Switch 246 of main power supply 218 remains closed while transient control signal 1004 is high, and main power supply 218 provides power signal $V_s$ at its maximum voltage.

Transient control circuit 1023b comprises diodes 1038, 1040, capacitors 1042, 1044 and 1046, resistors 1048 and 1050 and an amplifier 1052. The cathode of diode 1038 is coupled to the output of one-shot circuit 1032. The anode of diode 1038 defines a node 1054 and is coupled to ground through capacitor 1042. Node 1054 is coupled to the cathode of diode 1040 through parallel connected resistor 1048 and capacitor 1044. The anode of diode 1040 is coupled to a node 1056, which is also coupled to the output of amplifier 235 and to summer 237. Amplifier 1052 is coupled between the output of summer 237 and a node 1058, where it provides an amplified error signal 1039 which corresponds to error signal 239. Resistor 1050 and capacitor 1046 are coupled in parallel between nodes 1056 and 1058. Control circuit 216 is coupled to terminal 1058 and is responsive to amplified control signal 1039 to produce control signal 242.

Figure 18:
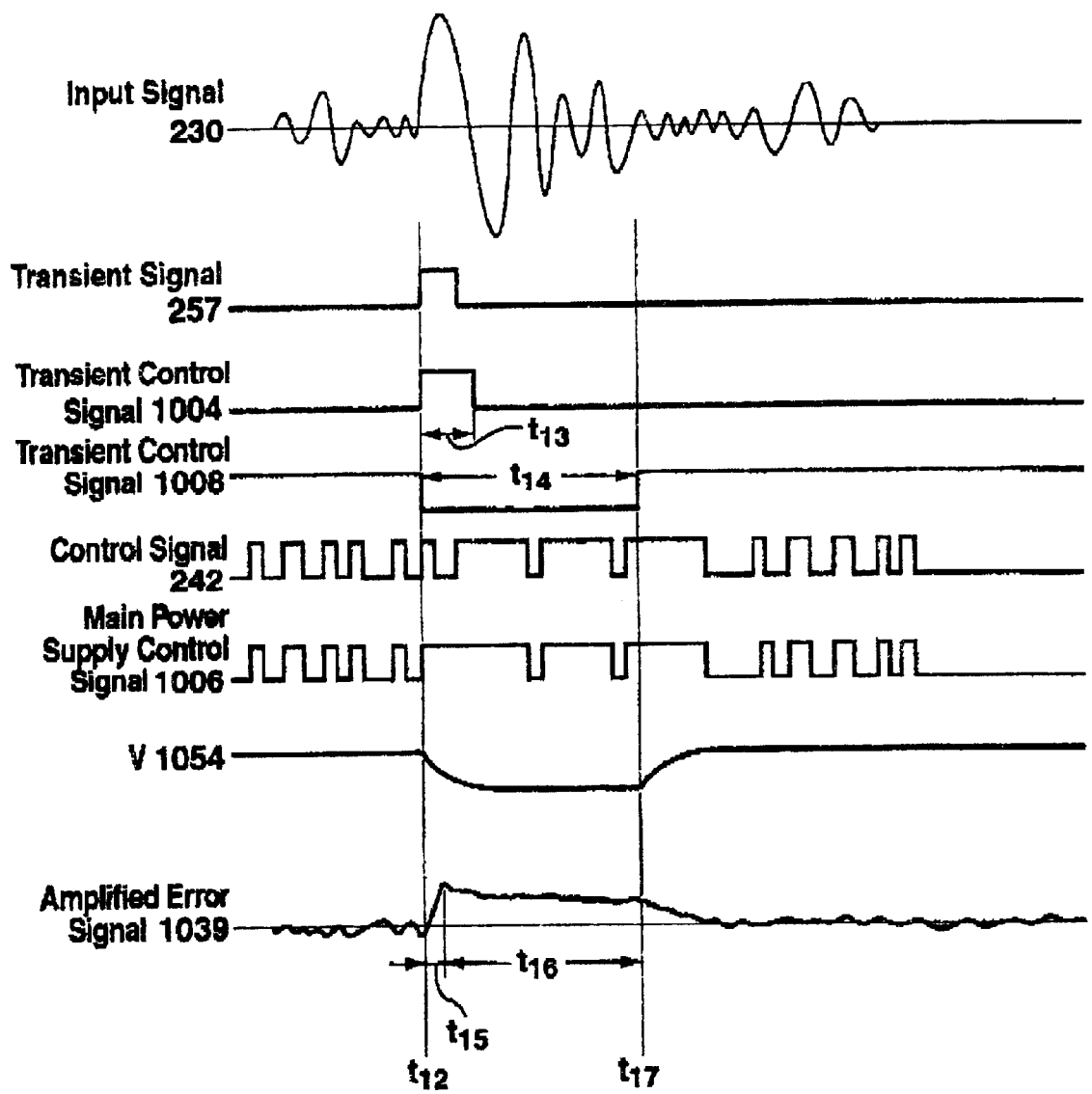
FIG. 18 is a timing diagram illustrating the operation of the power amplifier of FIG. 17.

The operation of power amplifier 1000 will now be explained with reference to FIG. 18. Prior to time $t_{12}$, power amplifier 1000 is in its normal operation. Capacitor 1042 is charged so that node 1054 has a voltage $V_{1054}$ equal to or higher than the voltage or error signal $V_{1056}$ at node 1056. Transient control signal 1004 is low and transient control signal 1008 is high. The normal level of transient control signal 1008 is selected to be approximately equal to or slightly higher than the maximum voltage $V_{1056}$ (i.e. the maximum voltage across capacitor 1042 when it is fully charged). Control circuit 216 generates control signal 242 in response to amplified error signal 1039 at terminal 1058. Main power supply control signal 1006 is identical to control signal 242.

Diode 1040 is optional and may be provided to prevent current from flowing from node 1054 to node 1056 when capacitor 1042 is charged. Amplifier 1000 (like amplifiers 100, 200, 280, 300, 400, 500, 600, 700 and 900) uses a closed loop feedback through amplifier 235, summer 237 and control circuit 216 to reduce error signal 239 by keeping voltage $V_{1056}$ approximately equal to the voltage $V_{1060}$ of 1060 (to the extent possible, given the limits of main power supply 218). Amplifier 1052, resistor 1050 and 1046 provide an additional feedback loop, to enhance the control of error signal 239 and to keep voltages $V_{1056}$ and $V_{1060}$ approximately equal. Amplifier 1052, resistor 1050 and 1048 may be optionally provided in any of the amplifiers described above. In normal operation, capacitor 1044 will be discharged.

At time $t_{12}$, transient detect block 219 detects a large transient in the level of input signal 230 and sets transient signal 257 high. In response, one-shot circuit 1030 sets transient control signal 1004 high for a selected time period $t_{13}$ and one-shot circuit 1032 sets transient control signal 1008 low for a selected time period $t_{14}$. Capacitor 1042 begins to discharge through diode 1038 into one-shot circuit 1032, causing voltage $V_{1054}$ to fall. The low voltage of transient control signal 1008 is selected to sufficiently discharge capacitor 1042 so that the one-shot circuit 1032 begins to draw current from node 1056. For example, the low voltage of transient control signal 1008 may be selected to be ground, so that capacitor 1042 is fully discharged (assuming that the length of the low pulse is sufficiently long).

As voltage $V_{1054}$ falls, the feedback structure of power amplifier 1000 attempts to keep voltage $V_{1056}$ approximately equal to voltage $V_{1060}$. The feedback operation and amplifier 1052 force the magnitude of error signal 239, and the amplified error signal 1039 to rise. Resistors 1048 and 1050 act as a voltage divider. Since voltage $V_{1056}$ is controlled by the feedback structure, and since voltage $V_{1054}$ is falling as capacitor 1042 discharges, the voltage divider helps control the voltage to which amplified error signal 1039 rises. The rate at which error signal 239 and amplified error signal 1039 rise, during an initial period $t_{15}$, depends on the relative resistances of resistors 1048 and 1050 and on the rate at which voltage $V_{1054}$ falls, which in turn depends on the rate at which capacitor 1042 is discharged by one-shot circuit 1032. As amplified error signal 1039 rises, control circuit 216 increases the duty cycle of control signal 242.

As capacitor 1042 is discharged, one-shot circuit 1032 begins to draw current from node 1056, and from node 1058. Capacitors 1044 and 1046 begin to charge, allowing error signal 239 and amplified error signal 1039 to initially fall and then vary depending on the value of $V_{targ}$, which was described above, during time period $t_{16}$.

During time period $t_{13}$, main power supply control signal 1006 is high, causing main power supply to increase the magnitude of power supply $V_s$ through filter 250. During this time, the power signal $V_t$, which is identical to $V_s$, supplied to amplifier 204 increases, taking into account the relatively slow time constant of filter 250. Since switch 246 is held closed during this period, power signal $V_t$ will rise relatively rapidly and amplifier 204 will receive sufficient power to produce output signal 232 in response to input signal 230.

When time period $t_{13}$ ends, transient control signal 1004 becomes low and main power supply control signal 1006 again follows control signal 242. Time period $t_{13}$ is selected to be sufficiently long that (i) the magnitude of amplified error signal 1039 has risen, as described above in relation to time period $t_{15}$ and the early part of time period $t_{16}$ and (2) that the duty cycle of control signal 242 has increased sufficiently that main power supply 218 will provide sufficient power to amplifier 204 in response to control signal 242. Time period $t_{13}$ is preferably not substantially longer than is required for these conditions to be met, since any excess power delivered to amplifier 204 will be dissipated by amplifier 204.

After time period $t_{14}$, transient control signal 1008 becomes high again. Capacitor 1054 begins to charge until voltage $V_{1054}$ is equal to or high than voltage $V_{1056}$ (which will be a constantly varying voltage, depending on the magnitude of power signal $V_t$. If voltage $V_{1056}$ subsequently exceeds $V_{1054}$, capacitor 1042 will again charge until voltage $V_{1054}$ is equal to or higher than voltage $V_{1056}$.

During time $t_{16}$, amplified error signal 1039 remains amplified by the feedback operation described above and by the voltage divider formed by resistors 1048 and 1050. At time $t_{17}$, power amplifier 1000 returns to normal operation and amplified error signal 1039 returns gradually to its normal value, which will depend on the difference between rectified signal 240 and compensated power signal $V_{tr}$.

The length of time period $t_{14}$ is selected to be long enough to allow filter 250 to charge sufficiently that power signal $V_s$ is larger than $V_{req}$, and more preferably has reached $V_{targ}$. This will depend on the time constant of filter 250 in any particular embodiment of a power amplifier according to the present invention.

Power amplifier 1000 responds to transient signal 257 by increasing the duty cycle of main power supply control signal 1039, rather than by engaging a separate transient power supply, such as transient power supply 223 of power amplifier 200 (FIG. 2). Since power amplifier 1000 has only one power supply (main power supply 218), there is no need for diode 251 (FIG. 2).

The structure of power amplifiers 900 and 1000 may be combined with the overload detect blocks 362 of power amplifier 300 (FIG. 4) and may be used to power two or more channels, as described in relation to power amplifier 300. Power amplifiers 900 and 1000 may also be provided with low voltage power supplies 402 (and diodes 404) as described in relation to power amplifier 400 (FIG. 6). Power amplifiers 900 and 1000 may also be provided with a main power supply incorporating a resonant switching regulator, such as main power supply 518 described in relation to power amplifier 500 (FIG. 8), in place of main power supply 218. Power amplifier 900 and 1000 may also be provided with a post regulator 684 and the associated circuitry (rectifier 680, summer 681, amplifier 688 and summer 682), as described in relation to power amplifier 600 (FIG. 10). Power amplifier 900 and 1000 may also be implemented as a bridge amplifier by modifying rectifier 215 to be a full wave rectifier as described in relation to power amplifier 700 (FIG. 14). The EMI isolation circuit 800 of FIG. 15 may be used to decouple EMI from the input terminal 202.

A number of preferred embodiments of the present invention have been described. Many variations may be made on these embodiments, and in particular, features of some embodiments may be incorporated into other embodiments to provide an embodiment suited for a particular application. Such variations and other will be obvious to persons skilled in the art and will fall within the scope of the present invention, which is limited only by the appended claims.

We claim:

1. A power amplifier for receiving a first input signal at a first input terminal and for producing a first output signal at a first output terminal, said first output signal corresponding to said first input signal, a first signal amplifier being coupled to the first input terminal to receive the first input signal and coupled to the first output terminal to provide the first output signal, the first signal amplifier having a first power terminal for receiving a total power signal and said power amplifier having a first power supply circuit comprising:

(a) a first input signal compensation block coupled to the first input terminal to receive the first input signal and to provide a compensated input signal corresponding to the first input signal, wherein the compensated input signal defines a target power level;

(b) a power signal compensation block for receiving the total power signal and for providing a compensated power signal corresponding to the total power signal;

(c) a summer coupled to the first input signal compensation block and to the power signal compensation block for providing an error signal corresponding to a difference between the target power level and a power level of the total power signal;

(d) a control circuit coupled to the summer for receiving the error signal and for providing a first control signal and a second control signal in response to the error signal, wherein the first control signal corresponds to a target main power signal level and the second control signal corresponds to a target transient power signal level;

(e) a transient detect block coupled to the first input signal compensation block for providing a transient signal to identify a transient condition when a rate of change in a slew rate of the compensated input signal exceeds a selected transient threshold;

(f) a main power supply for providing a main power signal at the first power terminal in response to the first control signal; and (g) a selectively engageable transient power supply for providing a transient power signal at the first power terminal in response to the second control signal and the transient signal, wherein the transient power supply is engaged when the transient signal indicates that a transient condition exists;

wherein the control circuit provides the first and second control signals such that the target main power signal level is equal to or higher than the target transient power signal level and wherein the magnitude of the total power signal is generally equal to the higher of the magnitude of the main power signal or the magnitude of the transient power signal.

2. The power amplifier of claim 1 wherein the first input signal compensation block includes:

(i) an offset block for adding an offset to said first input signal to provide an offset input signal;

(ii) a frequency compensation block for receiving the offset input signal and for providing a corresponding frequency compensated signal having its voltage components phase advanced with respect to its current component; and (iii) a first rectifier for rectifying the frequency compensated signal to provide the compensated input signal.

3. The power amplifier of claim 2 wherein the frequency compensation block is configured to amplify the amplitude of the frequency compensated signal at selected frequency components, wherein said selected frequency components exceed a selected frequency compensation threshold.

4. The power amplifier of claim 3 wherein the amplitude of the selected frequency components is progressively amplified to a greater extent.

5. The power amplifier of claim 3 wherein the amplitude of the selected frequency components is equally amplified.

6. The power amplifier of claim 2 wherein the first rectifier is a half wave rectifier.

7. The power amplifier of claim 2 wherein the offset block is configured to add a smaller offset to the first input signal if the highest frequency component of the first input signal is less than a selected offset frequency threshold and to add a larger offset to the first input signal otherwise.

8. The power amplifier of claim 1 wherein the first input signal compensation block provides the compensated input signal corresponding to a target power level that exceeds the sum of the power required by the first signal amplifier to generate a first output signal corresponding to the first input signal and at least half of a ripple in the main power signal.

9. The power amplifier of claim 1 wherein the control circuit is a PWM circuit having a fixed switching frequency.

10. The power amplifier of claim 9 wherein the main power supply is a switching regulator including:

(i) a main power source;

(ii) a switch coupled to the power source and responsive to the first control signal to provide an unfiltered main power signal; and (iii) an integrating filter coupled to the switch to provide the main power signal corresponding to the unfiltered main power signal.

11. The power amplifier of claim 10 wherein the switching frequency is selected to limit EMI emitted by the main power supply to a selected maximum EMI limit.

12. The power supply of claim 10 wherein the transient detect block includes:

(i) a peak detector for providing a peak signal corresponding to a peak envelope of the compensated input signal;

(ii) a differentiator coupled to the peak detector for providing a differentiated signal corresponding to the rate of change of the compensated input signal; and (iii) a comparator for comparing the differentiated signal with the transient threshold to provide the transient signal;

and wherein the transient power supply includes:

(iv) a transient power source;

(v) a transient power regulator coupled to the control circuit for receiving the second control signal; and (vi) a transient supply switch for engaging the transient power regulator in response to the transient signal.

13. The power amplifier of claim 12 wherein the main power source and transient power source are the same.

14. The power amplifier of claim 12 wherein the transient power regulator is a linear regulator.

15. The power amplifier of claim 14 wherein the transient power regulator includes a MOSFET.

16. The power amplifier of claim 11 wherein a time constant of the integrating filter is selected to effectively smooth the main power signal compared to the unfiltered main power signal.

17. The power amplifier of claim 12 wherein a discharge rate of the peak detector is selected to correspond to a slew rate of the main power supply.

18. The power amplifier of claim 1 further including:

(i) an overload detect block coupled to the first signal amplifier to provide an overload signal corresponding to one or more overload conditions within the first signal amplifier; and (ii) means for combining the overload signal with the compensated input signal to provide an adjusted compensated input signal;

wherein the error signal corresponds to a difference between the adjusted compensated input signal and the compensated power signal.

19. The power amplifier of claim 18 wherein the means for combining is the summer.

20. The power amplifier of claim 18 wherein the means for combining is a second summer.

21. The power amplifier of claim 1 wherein a second signal amplifier is coupled to the first power terminal and a second input signal is received at a second input terminal and wherein the first input signal compensation block provides a first compensated input signal and further including:

(i) a second input signal compensation block for providing a second compensated input signal;

(ii) a first diode coupled between the first input signal compensation block and the transient detect block; and (iii) a second diode coupled between the second input signal compensation block and the transient detect block.

22. The power amplifier of claim 2 wherein the first control signal is a pulse density modulated control signal and wherein the main power supply is a resonant switching power regulator.

23. The power amplifier of claim 22 wherein the main power supply is a zero-current switching regulator and includes a LC resonant tank.

24. The power amplifier of claim 1 further including a low voltage power supply coupled for providing a fixed low voltage power signal to the first power terminal, wherein the total power signal is generally equal to the higher of the magnitude of the main power signal, the magnitude of the transient power signal or the magnitude of the low voltage power signal.

25. The power amplifier of claim 24 wherein the control circuit is configured to set the main power signal to zero when the target power level is less than the magnitude of the low voltage power signal.

26. The power amplifier of claim 22 further including a post regulation circuit having:

(i) an overload detect block coupled to the first signal amplifier to provide an overload signal corresponding to one or more overload conditions within the first signal amplifier;

(ii) a second rectifier coupled to the offset block for receiving the offset input signal and providing a rectified input signal;

(iii) a third summer for subtracting the overload signal from the rectified input signal to provide a regulation signal;

(iv) a regulation amplifier coupled to the third summer for providing an amplified regulation signal corresponding to the regulation signal and having a magnitude range corresponding to the magnitude range of the total power signal;

(v) a post regulator having a control terminal, and coupled between the main and transient power supplies and the first power terminal; and (vi) a regulation feedback circuit coupled between the first power terminal and the control terminal of the post regulator and including a fourth summer for providing a regulator error signal corresponding to a difference between the total power signal and the amplified regulation signal;

wherein the post regulator regulates the total power signal in response to the regulator error signal when an overload condition occurs.

27. The power amplifier of any one of claims 7–21 or 22–26 wherein the first signal amplifier is a bridge amplifier and wherein the first rectifier is a full wave rectifier.

28. The power amplifier of any of claims 1–21 or 22–26 wherein the first signal amplifier has a second power terminal and further including a second power supply circuit having a same structure as said first power supply circuit, wherein said first power supply circuit supplies power to said first signal amplifier at said first power terminal during positive half wave of said first output signal and said second power supply circuit provides power to said first signal amplifier at said second power terminal during negative half waves of said first output signal.

29. The power amplifier of claim 1 further including an EMI isolation circuit coupled between said first input terminal and an internal input terminal for providing a first EMI-decoupled signal corresponding to said first input signal at said internal input terminal, and wherein said first input signal compensation block and said first signal amplifier are coupled to said internal input terminal, wherein the EMI isolation circuit has:

(i) a first isolation amplifier having a first amplification factor coupled to said first input terminal through a first impedance for receiving said first input signal and for providing an amplified input signal; and (ii) a second isolation amplifier having a second amplification factor coupled to said first amplifier for receiving said amplified input signal and to said internal input terminal for providing said first EMI-decoupled signal;

wherein the first amplification factor of the first isolation amplifier is greater than 1 and the second amplification factor of said second isolation amplifier is less than 1.

30. The power amplifier of claim 29 wherein said first impedance is greater than 50 k$\Omega$.

31. The power amplifier of claim 29 wherein said first impedance is equal to or greater than 100 kΩ.

32. The power amplifier of claim 29 wherein the EMI isolation circuit further has an EMI shield for encompassing the first and second isolation amplifiers and the first power supply circuit.

33. A power amplifier for receiving a first input signal at a first input terminal and for producing a first output signal at a first output terminal, said first output signal corresponding to said first input signal, a first signal amplifier being coupled to the first input terminal to receive the first input signal and coupled to the first output terminal to provide the first output signal, the first signal amplifier having a first power terminal for receiving a total power signal and said power amplifier having a first power supply circuit comprising:

(a) a first input signal compensation block coupled to the first input terminal to receive the first input signal and to provide a compensated input signal corresponding to the first input signal, wherein the compensated input signal defines a target power level;

(b) a power signal compensation block for receiving the total power signal and for providing a compensated power signal corresponding to the total power signal;

(c) a summer coupled to the first input signal compensation block and to the power signal compensation block for providing an error signal corresponding to a difference between the target power level and the power level of the total power signal;

(d) a transient detect block coupled to the first input signal compensation block for providing a transient signal to identify a transient condition when a rate of change in a slew rate of the compensated input signal exceeds a selected transient threshold;

(e) a first transient control circuit coupled to the transient detect block for providing first and second digital transient control signals, wherein the first digital transient control signal indicates the occurrence of a transient condition for a first time period in response to the transient signal and wherein the second digital transient control signal indicates the occurrence of a transient condition for a second time period in response to the transient signal, and wherein the second time period is longer than the first time period;

(f) a control circuit coupled to the summer for receiving an amplified error signal for providing a first control signal in response to the amplified error signal;

(g) a signal combining block for combining the first control signal and the first transient control signal to provide a main power supply control signal;

(h) a selectively engageable second transient control circuit coupled to the first transient control circuit for receiving the second digital transient control signal and for temporarily increasing the magnitude of the error signal, wherein the second transient control circuit is engaged and disengaged in response to the second digital transient control signal, the second transient control circuit including a feedback amplifier coupled between the summer and the control circuit to provide the amplified error signal, the feedback amplifier being operative at all times; and (i) a main power supply for providing a main power signal at the first power terminal in response to the main power supply control signal;

wherein the total power signal corresponds to the main power signal.

34. The first power supply circuit of claim 33 wherein the first transient control circuit includes a first one-shot circuit for generating the first digital transient control signal, wherein the first one-shot circuit is triggered by the transient signal indicating the occurrence of a transient condition.

35. The first power supply circuit of claim 34 wherein the first transient control circuit includes a second one-shot circuit for generating the second digital transient control signal, wherein the second one-shot is triggered by the transient signal indicating the occurrence of a transient condition.

36. The first power supply circuit of claim 35 wherein the second transient control circuit includes:

(i) a fast attack block for initially increasing the error signal rapidly when the second transient control circuit becomes engaged; and (ii) a slow release block for slowly reducing the increase in the error signal.

37. The first power supply circuit of claim 36 wherein the first time period is selected to be longer than the time required for the fast attack block to increase the magnitude of the error signal.

38. The first power supply circuit of claim 36 wherein the second transient control circuit comprises:

(i) a first diode having its cathode coupled to the output of the second one-shot circuit and having its anode coupled to a first node;

(ii) a first capacitor coupled between the first node and ground;

(iii) a first resistor and a second capacitor coupled in parallel between the first node and a second node, wherein the second node is coupled to a third node at the coupling of the summer and the power signal compensation block; and (iv) a feedback network including a second resistor and a third capacitor coupled between the third node and a fourth node at the coupling of the feedback amplifier and the control circuit.

39. The first power supply circuit of claim 38 wherein:

(i) the second digital transient control signal is normally high in the absence of a transient condition and becomes low when the second one-shot is triggered;

(ii) the first capacitor is normally charged in the absence of a transient condition and is discharged through the first diode when the second one-shot is triggered; and (iii) the first and second resistances act as a voltage divider in response to the discharging of the first capacitor to initially increase the magnitude of the amplified error signal.

40. The first power supply circuit of claim 36 wherein the signal combining block includes an OR gate.

41. The first power supply circuit of claim 38 wherein the first input compensation block includes:

(i) an offset block for adding an offset to said first input signal to provide an offset input signal;

(ii) a frequency compensation block for receiving the offset input signal and for providing a corresponding frequency compensated signal having its voltage components phase advanced with respect to its current component; and (iii) a first rectifier for rectifying the frequency compensated signal to provide the compensated input signal.

42. The first power supply circuit of claim 41 wherein the frequency compensation block is configured to amplify the amplitude of the frequency compensated signal at selected frequency components, wherein said selected frequencies exceed a selected frequency compensation threshold.

43. The first power supply circuit of claim 42 wherein the amplitude of the selected frequency components is progressively amplified to a greater extent.

44. The first power supply circuit of claim 42 wherein the amplitude of the selected frequency components is equally amplified.

45. The first power supply circuit of claim 41 wherein the first rectifier is a half wave rectifier.

46. The first power supply circuit of claim 41 wherein the offset block is configured to add a smaller offset to the first input signal if the highest frequency component of the first input signal is less than a selected offset frequency threshold and to add a larger offset to the first input signal otherwise.

47. The first power supply circuit of claim 41 wherein the first input signal compensation block provides the compensated input signal corresponding to a target power level that exceeds the sum of the power required by the first signal amplifier to generate a first output signal corresponding to the first input signal and at least half of a ripple in the main power signal.

48. The first power supply circuit of claim 39 wherein the control circuit is a PWM signal having a fixed switching frequency.

49. The first power supply circuit of claim 38 wherein the main power supply is a switching regulator including:
(i) a main power source;
(ii) a switch coupled to the main power source and responsive to the first control signal to provide an unfiltered main power signal; and
(iii) an integrating filter coupled to switch to provide the main power signal corresponding to the unfiltered main power signal.

50. The first power supply circuit of claim 49 wherein a switching frequency is selected to limit EMI emitted by the main power supply to a selected maximum EMI limit.

51. The first power supply of claim 49 wherein the transient detect block includes:
(i) a peak detector for providing a peak signal corresponding to a peak envelope of the compensated input signal;
(ii) a differentiator coupled to the peak detector for providing a differentiated signal corresponding to a rate of change of the compensated input signal; and
(iii) a comparator for comparing the differentiated signal with the transient threshold to provide the transient signal.

52. The first power supply circuit of claim 50 wherein a time constant of the integrating filter is selected to effectively smooth the main power signal compared to the unfiltered main power signal.

53. The first power supply circuit of claim 51 wherein a discharge rate of the peak detector is selected to correspond to a slew rate of the main power supply.

54. The first power supply circuit of claim 39 further including:
(i) an overload detect block coupled to the first signal amplifier to provide an overload signal corresponding to one or more overload conditions within the first signal amplifier; and
(ii) means for combining the overload signal with the compensated input signal to provide an adjusted compensated input signal;
wherein the error signal corresponds to a difference between the adjusted compensated input signal and compensated power signal.

55. The first power supply circuit of claim 54 wherein the means for combining is the summer.

56. The first power supply circuit of claim 54 wherein the means for combining is a second summer.

57. The first power supply circuit of claim 39 wherein a second signal amplifier is coupled to the first power terminal and a second input signal is received at a second input terminal and wherein the first input signal compensation block provides a first compensated input signal and further including:
(i) a second input signal compensation block for providing a second compensated input signal;
(ii) a first diode coupled between the first input signal compensation block and the transient detect block; and
(iii) a second diode coupled between the second input signal compensation block and the transient detect block.

58. The first power supply circuit of claim 39 wherein the first control signal is a pulse density modulated control signal and wherein the main power supply is a resonant switching power regulator.

59. The first power supply circuit of claim 58 wherein the main power supply is a zero-current switching regulator and includes an LC resonant tank.

60. The first power supply circuit of claim 39 further including a low voltage power supply coupled for providing a fixed low voltage power signal to the first power terminal, wherein the total power signal is generally equal to the higher of the magnitude of the main power signal, the magnitude of the transient power signal or the magnitude of the low voltage power signal.

61. The first power supply circuit of claim 60 wherein the control circuit is configured to set the main power signal to zero when the target power level is less than the magnitude of the low voltage power signal.

62. The first power supply circuit of claim 58 further including a post regulation circuit having:
(i) an overload detect block coupled to the first signal amplifier to provide an overload signal corresponding to one or more overload conditions within the first signal amplifier;
(ii) a second rectifier coupled to the offset block for receiving the offset input signal and providing a rectified input signal;
(iii) a third summer for subtracting the overload signal from the rectified input signal to provide a regulation signal;
(iv) a regulation amplifier coupled to the third summer for providing an amplified regulation signal corresponding to the regulation signal and having a magnitude range corresponding to the magnitude range of the total power signal;
(v) a post regulator having a control terminal, and coupled between the main and transient power supplies and the first power terminal; and
(vi) a regulation feedback circuit coupled between the first power terminal and the control terminal of the post regulator and including a fourth summer for providing a regulator error signal corresponding to a difference between the total power signal and the amplified regulation signal;
wherein the post regulator regulates the total power signal in response to the regulator error signal when an overload condition occurs.

63. The first power supply circuit of any one of claims 39–44 or 46–57 or 58–62 wherein the first signal amplifier is a bridge amplifier and wherein the first rectifier is a full wave rectifier.

64. The power amplifier of any of claims 39–57 or 58–62 wherein the first signal amplifier has a second power terminal and further including a second power supply circuit having a same structure as said first power supply circuit, wherein said first power supply circuit supplies power to said first signal amplifier at said first power terminal during positive half wave of said first output signal and said second power supply circuit provides power to said first signal amplifier at said second power terminal during negative half waves of said first output signal.

65. The power amplifier of claim 33 further including an EMI isolation circuit coupled between said first input terminal and an internal input terminal for providing a first EMI-decoupled signal corresponding to said first input signal at said internal input terminal, and wherein said first input signal compensation block and said first signal amplifier are coupled to said internal input terminal, wherein the EMI isolation circuit has:
  (i) a first isolation amplifier having a first amplification factor coupled to said first input terminal through a first impedance for receiving said first input signal and for providing an amplified input signal; and
  (ii) a second isolation amplifier having a second amplification factor coupled to said first amplifier for receiving said amplified input signal and to said internal input terminal for providing said first EMI-decoupled signal;
wherein the first amplification factor of the first isolation amplifier is greater than 1 and the second amplification factor of said second isolation amplifier is less than 1.

66. The power amplifier of claim 62 wherein said first impedance is greater than 50 kΩ.

67. The power amplifier of claim 62 wherein said first impedance is equal to or greater than 100 kΩ.

68. A method of supplying a total power signal to a signal amplifier, comprising:
  (a) receiving an input signal;
  (b) producing a compensated input signal corresponding to the input signal, the compensated input signal defining a target power level for the total power signal;
  (c) comparing the compensated input signal to a reduced version of the total power signal to produce an error signal;
  (d) providing first and second control signals in response to the error signal;
  (e) providing a main power signal using a switching regulator in response to the first control signal, the main power signal being a first part of the total power signal;
  (f) comparing a rate of change of the compensated input signal to a selected transient threshold to provide a transient signal, the transient signal identifying a transient condition when the rate of change exceeds the transient threshold, the transient threshold corresponding to a maximum slew rate of the main power signal; and
  (g) engaging a transient power supply to provide a transient power signal in response to said second control signal, when the transient signal indicates the transient condition, the transient power signal being a second part of the total power signal.

69. The method of claim 68 wherein step (b) includes:
  (i) adding an offset to the input signal;
  (ii) amplifying frequency components of the input signal exceeding a selected threshold frequency; and
  (iii) rectifying the result of step (b).

70. The method of claim 69 wherein step (i) is performed after step (iii).

71. The method of claim 69 wherein step (i) is performed by adding a smaller offset to frequency components below a selected threshold and adding a larger offset to frequency components above the threshold.

72. The method of claim 68 wherein step (f) is performed by:
  (i) peak detecting the compensated input signal;
  (ii) differentiating the result of step (i); and
  (iii) comparing the result of step (ii) with the transient threshold.

73. The method of claim 72 wherein a discharge rate of the peak detector is selected to correspond to the slew rate of the main power signal.

74. The method of claim 68 further including providing an overload signal corresponding to an overload condition in the signal amplifier and reducing the magnitude of the main power signal in response to the overload signal.

75. The method of claim 68 wherein the first control signal is a PWM signal.

76. The method of claim 68 wherein the switching regulator is a resonant switching power regulator, and wherein the first control signal is a PDM signal.

77. The method of claim 68 further including providing a low voltage DC power signal as a third part of the total power signal.

78. The method of claim 77 further including disabling the switching regulator when the target power level is less than the magnitude of the low voltage DC power signal.

79. The method of claim 68 further including regulating the total power signal using a post regulator.

80. The method of claim 79 further including providing an overload signal corresponding to an overload condition in the signal amplifier and reducing the magnitude of the total power signal in response to the overload signal.

81. The method of claim 69 wherein the signal amplifier is a bridge amplifier and step (iii) is performed by full wave rectifying the result of step (ii).

82. A method of supplying a total power signal to a signal amplifier, comprising:
  (a) receiving an input signal;
  (b) producing a compensated input signal corresponding to the input signal, the compensated input signal defining a target power level for the total power signal;
  (c) comparing the compensated input signal to a reduced version of the total power signal to produce an error signal;
  (d) providing first and second control signals in response to the error signal;
  (e) providing a main power signal using a switching regulator in response to the first control signal, the main power signal being a first part of the total power signal;
  (f) comparing a rate of change of the compensated input signal to a selected transient threshold to provide a transient signal, the transient signal identifying a transient condition when the rate of change exceeds the transient threshold, the transient threshold corresponding to a maximum slew rate of the main power signal; and
  (g) in response to a transient condition, temporarily engaging the switching regulator with a 100% duty cycle for a first time period and temporarily elevating the error signal for a second time period.

83. The method of claim 82 wherein step (b) includes:
  (i) adding an offset to the input signal;
  (ii) amplifying frequency components of the input signal exceeding a selected threshold frequency; and
  (iii) rectifying the result of step (b).

84. The method of claim 83 wherein step (i) is performed after step (iii).

85. The method of claim 83 wherein step (i) is performed by adding a smaller offset to frequency components below a selected threshold and adding a larger offset to frequency components above the threshold.

86. The method of claim 82 wherein step (f) is performed by:
(i) peak detecting the compensated input signal;
(ii) differentiating the result of step (i); and
(iii) comparing the result of step (ii) with the transient threshold.

87. The method of claim 86 wherein a discharge rate of the peak detector is selected to correspond to the slew rate of the main power signal.

88. The method of claim 82 further including providing an overload signal corresponding to an overload condition in the signal amplifier and reducing the magnitude of the main power signal in response to the overload signal.

89. The method of claim 82 wherein the first control signal is a PWM signal.

90. The method of claim 82 wherein the switching regulator is a resonant switching power regulator, and wherein the first control signal is a PDM signal.

91. The method of claim 82 further including providing a low voltage DC power signal as a second part of the total power signal.

92. The method of claim 91 further including disabling the switching regulator when the target power level is less than the magnitude of the low voltage DC power signal.

93. The method of claim 82 further including regulating the total power signal using a post regulator.

94. The method of claim 93 further including providing an overload signal corresponding to an overload condition in the signal amplifier and reducing the magnitude of the total power signal in response to the overload signal.

95. The method of claim 83 wherein the signal amplifier is a bridge amplifier and step (iii) is performed by full wave rectifying the result of step (ii).

96. A power amplifier for receiving a first input signal at a first input terminal and for producing a first output signal at a first output terminal, said first output signal corresponding to said first input signal, a first signal amplifier being coupled to the first input terminal to receive the first input signal and coupled to the first output terminal to provide the first output signal, the first signal amplifier having a first power terminal for receiving a total power signal and said power amplifier having a first power supply circuit comprising:

(a) a first input signal compensation block coupled to the first input terminal to receive the first input signal and to provide a compensated input signal corresponding to the first input signal, wherein the compensated input signal defines a target power level;

(b) a main power signal compensation block for receiving a main power signal and for providing a compensated main power signal corresponding to the main power signal;

(c) a first summer coupled to the first input signal compensation block and to the main power signal compensation block for providing a first error signal corresponding to a difference between the target power level and a power level of the main power signal;

(d) a first control circuit coupled to the first summer for receiving the first error signal and for providing a first control signal in response to the first error signal, wherein the first control signal corresponds to a target main power signal level;

(e) a total power signal compensation block for receiving the total power signal and for providing a compensated total power signal corresponding to the total power signal;

(f) a second summer coupled to the first input signal compensation block and to the total power signal compensation block for providing the second error signal corresponding to a difference between the target power level and a power level of the total power signal;

(g) a second control circuit coupled to the second summer for receiving the second error signal and for providing a second control signal in response to the second error signal, wherein the second control signal corresponds to a target transient power signal level;

(h) a transient detect block coupled to the first input signal compensation block for providing a transient signal to identify a transient condition when a rate of change in a slew rate of the compensated input signal exceeds a selected transient threshold;

(i) a main power supply for providing a main power signal at the first power terminal in response to the first control signal; and (j) a selectively engageable transient power supply for providing a transient power signal at the first power terminal in response to the second control signal and the transient signal, wherein the transient power supply is engaged when the transient signal indicates that a transient condition exists;

wherein the magnitude of the total power signal is generally equal to the higher of the magnitude of the main power signal or the magnitude of the transient power signal.

* * * * *